(12) United States Patent
Lim et al.

(10) Patent No.: US 11,621,050 B2
(45) Date of Patent: Apr. 4, 2023

(54) SEMICONDUCTOR MEMORY DEVICES AND REPAIR METHODS OF THE SEMICONDUCTOR MEMORY DEVICES

(71) Applicant: SK hynix Inc., Icheon-si (KR)

(72) Inventors: Jae Il Lim, Yeoju-si (KR); Su Hae Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 138 days.

(21) Appl. No.: 17/024,396

(22) Filed: Sep. 17, 2020

(65) Prior Publication Data

US 2021/0295944 A1 Sep. 23, 2021

(30) Foreign Application Priority Data

Mar. 19, 2020 (KR) .................. 10-2020-0033926

(51) Int. Cl.
| | |
|---|---|
| *G11C 29/44* | (2006.01) |
| *G11C 29/38* | (2006.01) |
| *G06F 11/20* | (2006.01) |
| *G11C 29/16* | (2006.01) |
| *G11C 29/00* | (2006.01) |

(52) U.S. Cl.
CPC .......... *G11C 29/44* (2013.01); *G06F 11/2094* (2013.01); *G11C 29/16* (2013.01); *G11C 29/38* (2013.01); *G11C 29/4401* (2013.01); *G11C 29/70* (2013.01); *G11C 29/76* (2013.01); *G11C 29/814* (2013.01); *G11C 29/816* (2013.01); *G06F 2201/85* (2013.01); *G11C 2029/4402* (2013.01)

(58) Field of Classification Search
CPC ......... G11C 29/44; G11C 29/16; G11C 29/38; G11C 29/4401; G11C 29/70; G11C 29/76; G11C 29/814; G11C 29/816; G11C 2029/4402; G11C 29/81; G11C 2029/1208; G11C 2029/3602; G11C 29/12; G11C 29/808; G06F 11/2094; G06F 2201/85
See application file for complete search history.

(56) References Cited

U.S. PATENT DOCUMENTS

| | | | | |
|---|---|---|---|---|
| 6,242,269 B1 * | 6/2001 | Whetsel | ......... | G01R 31/318536 438/11 |
| 6,634,003 B1 * | 10/2003 | Phan | ............ | G11C 29/76 365/45 |
| 7,143,321 B1 * | 11/2006 | Everett | ............ | G11C 29/08 714/36 |

(Continued)

FOREIGN PATENT DOCUMENTS

KR 1020130049421 A 5/2013

*Primary Examiner* — Steve N Nguyen
(74) *Attorney, Agent, or Firm* — William Park & Associates Ltd.

(57) ABSTRACT

A semiconductor memory device includes a memory and a memory controller configured to control the memory. The memory controller includes a normal operation control part and a repair part. The normal operation control part is configured to control a normal operation of the memory and includes a plurality of storage spaces used while the normal operation is controlled. The repair part is configured to control a repair operation of the memory and stores faulty addresses detected while the repair operation is controlled into the plurality of storage spaces included in the normal operation control part.

16 Claims, 25 Drawing Sheets

(56) References Cited

U.S. PATENT DOCUMENTS

| | | | |
|---|---|---|---|
| 2006/0239090 A1* | 10/2006 | Anazawa | G11C 29/4401 |
| | | | 365/200 |
| 2008/0065929 A1* | 3/2008 | Nadeau-Dostie | G11C 29/802 |
| | | | 714/E11.054 |
| 2013/0326312 A1* | 12/2013 | Lee | H01L 27/1158 |
| | | | 714/773 |
| 2014/0189226 A1* | 7/2014 | Seo | G11C 11/40622 |
| | | | 711/105 |

* cited by examiner

SEMICONDUCTOR MEMORY DEVICES AND REPAIR METHODS OF THE SEMICONDUCTOR MEMORY DEVICES

CROSS-REFERENCE TO RELATED APPLICATIONS

The present application claims priority under 35 U.S.C. 119(a) to Korean Application No. 10-2020-0033926, filed on Mar. 19, 2020, which is incorporated herein by reference in its entirety.

BACKGROUND

1. Technical Field

Various embodiments of the present teachings relate to semiconductor memory systems and, more particularly, to semiconductor memory devices including a repair logic circuit and repair methods of the semiconductor memory systems.

2. Related Art

As semiconductor technologies are developed, high performance memory devices having a large storage capacity have been produced. Recently, in mass production of memory devices, various repair techniques for replacing faulty cells (also, referred to as failed cells) with spare cells (also, referred to as redundant cells) have been inevitably used to improve the fabrication yield and the quality of the memory devices. Embedded memory devices employed in most of system-on-chips (SOCs) are tested and repaired using separate high-cost test apparatuses to increase total fabrication cost of the embedded memory devices. Thus, failure information on the failed cells has been obtained through a built-in self-test (BIST) circuit, and the failed cells have been repaired using a built-in redundancy analysis (BIRA) circuit.

The embedded memory devices may have a relatively small memory size, and the number of spare cells of the embedded memory devices may be relatively less. Thus, it may be possible to reduce a repair analysis time by storing faulty addresses (also, referred to as failure addresses) obtained by the BIST circuit into a content addressable memory (CAM) in the BIRA circuit. However, in case of general memory (e.g., general dynamic random access memories (DRAMs) having a relatively large memory size and a relatively large number of spare cells) employed in a dual-in-line memory module (DIMM), the number of the faulty addresses may increase. This may lead to increase of an area that the CAM storing the faulty addresses occupies. Accordingly, an area of a repair part of a memory controller may also increase.

SUMMARY

According to an embodiment, a semiconductor memory device includes a memory and a memory controller configured to control the memory. The memory controller includes a normal operation control part and a repair part. The normal operation control part is configured to control a normal operation of the memory and includes a plurality of storage spaces used while the normal operation is controlled. The repair part is configured to control a repair operation of the memory and configured to store faulty addresses detected while the repair operation is controlled into the plurality of storage spaces included in the normal operation control part.

According to another embodiment, there is provided a repair method of a semiconductor memory device including a memory and a memory controller having a plurality of storage spaces used to control a normal operation of the memory. The repair method includes relocating the plurality of storage spaces as a plurality of shared spaces disposed to have a pipe-line structure, detecting a faulty address of a faulty cell through a test operation for the memory, storing the detected faulty address into one of the shared spaces, and determining a repair solution based on the stored faulty address.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to semiconductor memory devices and repair methods of the semiconductor memory devices.

Figure 1:
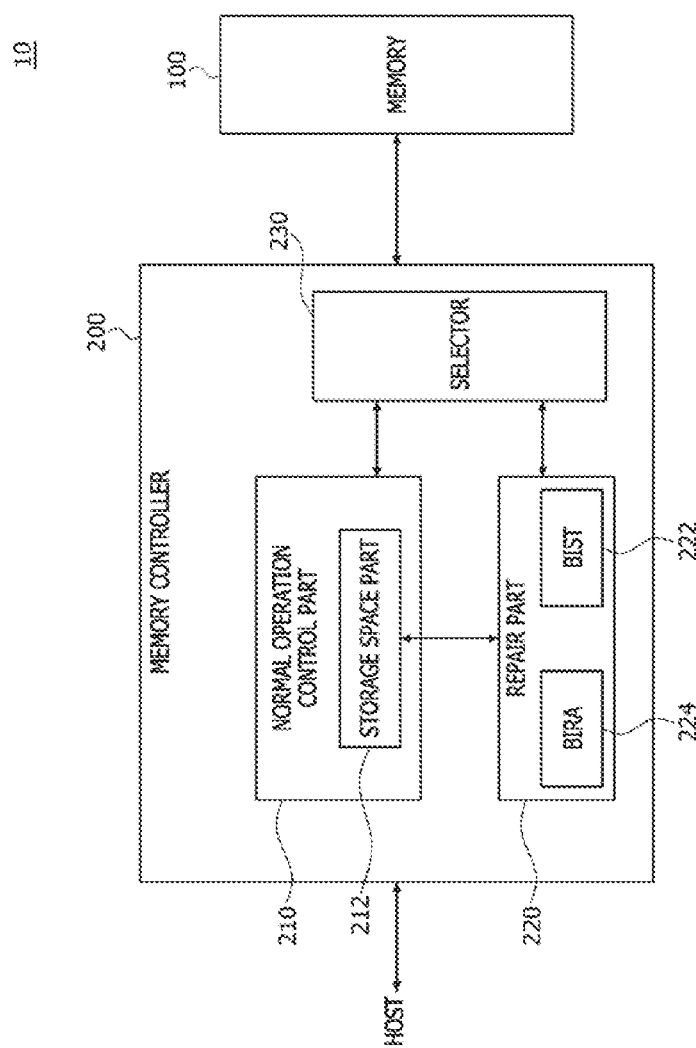
FIG. 1 is a block diagram illustrating a semiconductor memory device according to an embodiment of the present teachings.

FIG. 1 is a block diagram illustrating a semiconductor memory device 10 according to an embodiment of the present teachings. Referring to FIG. 1, the semiconductor memory device may include a memory 100 and a memory controller 200. In an embodiment, the semiconductor memory device 10 may be realized to have a DIMM structure that the memory 100 and the memory controller 200 are integrated on a single substrate. The memory 100 may have a data storage space. Data may be written into the data storage space of the memory 100 by a write operation performed by a request of the memory controller 200. In addition, the data written into the data storage space of the memory 100 may be read out by a read operation performed by a request of the memory controller 200. In an embodiment, the memory 100 may include a volatile memory such as a dynamic random access memory (DRAM). Alternatively, the memory 100 may include a nonvolatile memory such as a flash memory, a phase change random access memory (PCRAM), a resistive random access memory (ReRAM), a ferroelectric random access memory (FeRAM), or a magnetic resistance random access memory (MRAM).

The memory controller 200 may include a normal operation control part 210 controlling a normal operation of the memory 100, a repair part 220 controlling a repair operation for the memory 100, and a selector 230. In the present embodiment, the normal operation of the memory 100 may be defined as the read operation and the write operation for the memory 100. In addition, the repair operation for the memory 100 may be defined as an operation for replacing faulty cells of the memory 100 with spare cells in the memory 100. The normal operation control part 210 may control an access operation for accessing to the memory 100 in response to a command outputted from a host. The normal operation control part 210 may control the read operation for the memory 100 when a read command and an address are transmitted from the host to the memory controller 200. The normal operation control part 210 may control the write operation for the memory 100 when a write command, an address, and write data are transmitted from the host to the memory controller 200.

The normal operation control part 210 may include a storage space part 212. In an embodiment, the storage space part 212 may have a function that temporarily stores read data or write data while the normal operation for the memory 100 is controlled. In an embodiment, the storage space part 212 may have a function that stores data in the normal operation control part 210 while the normal operation for the memory 100 is controlled. In an embodiment, the storage space part 212 may include registers. The registers of the storage space part 212 may be realized using a plurality of flip-flops or static random access memories (SRAMs). In an embodiment, the registers of the storage space part 212 may be realized using a single SRAM.

The repair part 220 may include a BIST circuit 222 and a BIRA circuit 224. The BIST circuit 222 may generate test patterns for detecting faulty cells in the memory 100. The BIST circuit 222 may test the memory 100 using the test patterns. If a faulty cell is detected while the memory 100 is tested, the BIST circuit 222 may transmit a faulty address (i.e., an address of the faulty cell) to the BIRA circuit 224. The BIRA circuit 224 may store the faulty address transmitted from the BIST circuit 222. In such a case, the BIRA circuit 224 may compare the current faulty address outputted from the BIST circuit 222 with previous faulty addresses stored therein to store the current faulty address in an appropriate way according to the comparison result. The BIST circuit 222 and the BIRA circuit 224 may simultaneously operate. That is, while a test operation is performed by the BIST circuit 222, the BIRA circuit 224 may perform an operation for storing the faulty address. If the BIST circuit 222 terminates the test operation, the BIRA circuit 224 may analyze the stored faulty addresses to fine out a repair solution through redundancy analysis (RA). In the present embodiment, the BIRA circuit 224 may use the storage space part 212 included in the normal operation control part 210 as a space for storing the faulty address outputted from the BIST circuit 222. That is, no extra storage space is required in the BIRA circuit 224 to store the faulty address.

The selector 230 may select and enable any one of a first signal transmission path between the normal operation control part 210 of the controller 200 and the memory 100 and a second signal transmission path between the repair part 220 of the controller 200 and the memory 100. In such a case, the non-selected signal transmission path may be disabled. In an embodiment, the selector 230 may operate in response to a mode selection control signal. For example, if a first mode selection control signal requesting the normal operation is inputted to the selector 230, the selector 230 may selectively enable the first signal transmission path between the normal operation control part 210 and the memory 100. Accordingly, a command, an address, and data may be transmitted between the normal operation control part 210 and the memory 100. In such a case, no signal is transmitted between the repair part 220 of the controller 200 and the memory 100. In contrast, if a second mode selection control signal requesting the repair operation is inputted to the selector 230, the selector 230 may selectively enable the second signal transmission path between the repair part 220 and the memory 100. Accordingly, a command, an address, and data may be transmitted between the repair part 220 and the memory 100. In such a case, no signal is transmitted between the normal operation control part 210 and the memory 100.

Figure 2:
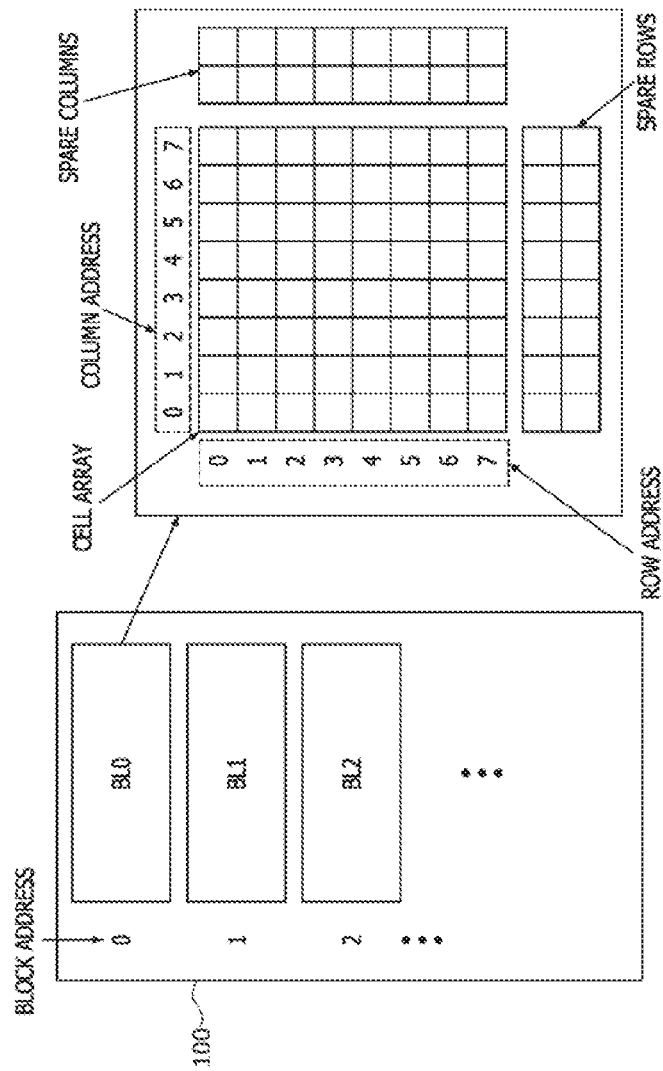
FIG. 2 illustrates an example of a configuration of a memory included in a semiconductor memory device according to an embodiment of the present teachings.

FIG. 2 illustrates an example of a configuration of the memory 100 included in the semiconductor memory device 10 according to an embodiment of the present teachings. Referring to FIG. 2, the memory 100 may include a plurality of memory blocks BL0, BL1, . . . . The memory blocks BL0, BL1, . . . may have the same configuration. That is, a configuration of the first memory block BL0 described hereinafter may be equally applicable to the remaining memory blocks. In addition, the configuration of the first memory block BL0 provided by the present embodiment may be merely an example. Thus, each of the plurality of memory blocks BL0, BL1, . . . may be configured to be different according to a type or a function of the memory 100.

The first memory block BL0 may include a cell array, spare rows, and spare columns. A plurality of main memory cells may be disposed in the cell array. The plurality of main memory cells may be disposed in a matrix form defined by a plurality of rows and a plurality of columns. Although FIG. 2 illustrates an example in which the cell array is configured to include only eight rows and eight columns, the present teachings are not limited thereto. The main memory cells arrayed in any one of the eight rows may be designated by a row address. For example, eight main memory cells arrayed in a first row may be designated by a row address of "0." Similarly, the main memory cells arrayed in any one of the eight columns may be designated by a column address. For example, eight main memory cells arrayed in a first column may be designated by a column address of "0." Thus, the main memory cell located at a cross point of the second row and the third column may be designated by the row address of "1" and the column address of "2."

The spare rows may be provided to replace the main memory cells arrayed in the rows including faulty cells among the main memory cells disposed in the cell array. For example, when one of the main memory cells arrayed in the fourth row (i.e., designated by the row address of "3") in the cell array is a faulty cell, the main memory cells arrayed in the fourth row may be replaced with the spare cells arrayed in one of the spare rows. Although FIG. 2 illustrates an example in which the number of the spare rows is two, the present teachings are not limited thereto. That is, in some other embodiments, the number of the spare rows may be greater or less than two. In the present embodiment, the number of the spare rows is two, as illustrated in FIG. 2. Thus, when the number of the rows having the faulty cells in the cell array is greater than two, it may be impossible to repair the faulty cells in the cell array using only the spare rows. The number of columns in each of the spare rows may be equal to the number of columns in the cell array.

The spare columns may be provided to replace the main memory cells arrayed in the columns including faulty cells among the main memory cells disposed in the cell array. For example, when one of the main memory cells arrayed in the third column (i.e., designated by the column address of "2") in the cell array is a faulty cell, the main memory cells arrayed in the third column may be replaced with the spare cells arrayed in one of the spare columns. Although FIG. 2 illustrates an example in which the number of the spare columns is two, the present teachings are not limited thereto. That is, in some other embodiments, the number of the spare columns may be greater or less than two. In the present embodiment, the number of the spare columns is two, as illustrated in FIG. 2. Thus, when the number of the columns having the faulty cells in the cell array is greater than two, it may be impossible to repair the faulty cells in the cell array using only the spare columns. The number of rows in each of the spare columns may be equal to the number of rows in the cell array.

Figure 3:
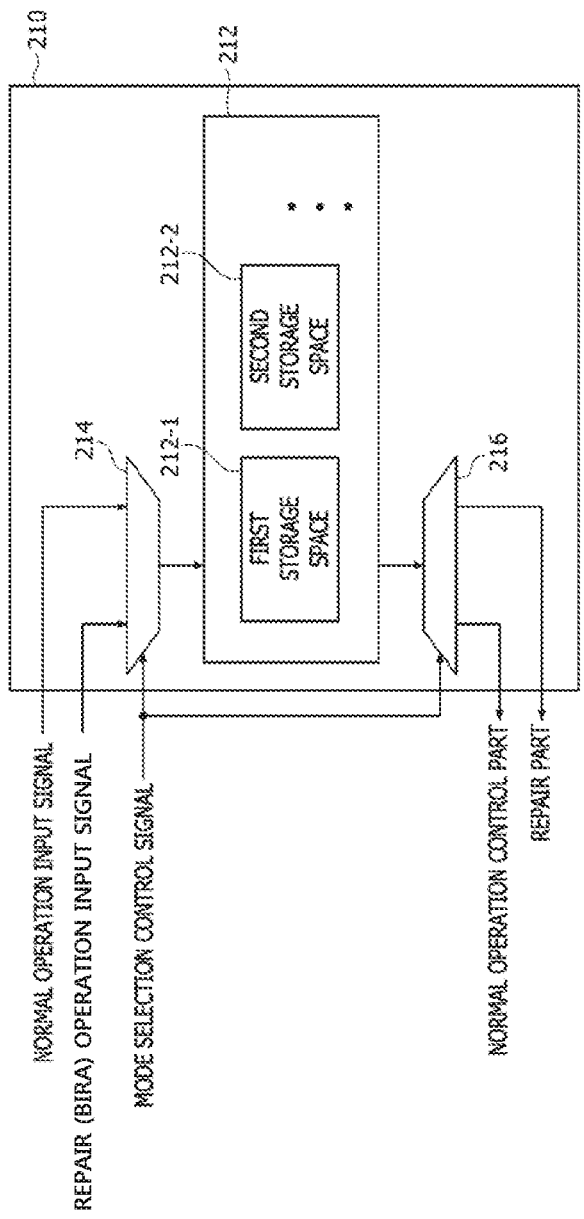
FIG. 3 illustrates an example of a configuration of a normal operation control part of a memory controller included in a semiconductor memory device according to an embodiment of the present teachings.

FIG. 3 illustrates an example of a configuration of the normal operation control part 210 of the memory controller 200 included in the semiconductor memory device 10 according to an embodiment of the present teachings. Referring to FIG. 3, the normal operation control part 210 of the memory controller (200 of FIG. 1) may include the storage space part 212, a multiplexer 214, and a demultiplexer 216. In the present embodiment, the storage space part 212 may be configured to include a plurality of storage spaces 212-1, 212-2, . . . . When the memory controller (200 of FIG. 1) controls the normal operation for the memory (100 of FIG. 1), the storage spaces 212-1, 212-2, . . . of the storage space part 212 may store data generated by the normal operation for the memory 100. In contrast, when the memory controller (200 of FIG. 1) controls the repair operation for the memory (100 of FIG. 1), the storage spaces 212-1, 212-2, . . . of the storage space part 212 may be used to store faulty addresses generated by an operation of the BIRA circuit 224. In an embodiment, the first storage space 212-1 of the storage space part 212 may be a register, and the second storage space 212-2 of the storage space part 212 may be an SRAM. The first and second storage spaces 212-1 and 212-2 may selectively receive data through the multiplexer 214 and may output the data through a path which is selected by the demultiplexer 216.

The multiplexer 214 may select data inputted to the storage space part 212. A normal operation input signal may be applied to a first input terminal of the multiplexer 214. A repair operation input signal, specifically, a BIRA operation input signal may be applied to a second input terminal of the multiplexer 214. A mode selection control signal may be applied to a control terminal of the multiplexer 214. The multiplexer 214 may selectively output any one of the normal operation input signal and the repair operation input signal though an output terminal of the multiplexer 214 according to a logic level of the mode selection control signal. In an embodiment, when the mode selection control signal has a logic level corresponding to a normal operation mode, the multiplexer 214 may output the normal operation input signal. In contrast, when the mode selection control signal has a logic level corresponding to a BIRA operation mode, the multiplexer 214 may output the BIRA operation input signal. An output signal of the multiplexer 214 may be inputted to the storage space part 212.

The demultiplexer 216 may select a transmission path of data which are outputted from the storage space part 212. An output signal of the storage space part 212 may be inputted to an input terminal of the demultiplexer 216. The demultiplexer 216 may output the output signal of the storage space part 212 through one of a first output terminal and a second output terminal. The first output terminal of the demultiplexer 216 may be coupled to a transmission path in the normal operation control part 210. The second output terminal of the demultiplexer 216 may be coupled to the BIRA circuit (224 of FIG. 1) included in the repair part (220 of FIG. 1). One of the first and second output terminals of the demultiplexer 216 may be selected by the mode selection control signal which is inputted to a control terminal of the demultiplexer 216. In an embodiment, when the mode selection control signal has a logic level corresponding to the normal operation mode, the demultiplexer 216 may enable the first output terminal. In such a case, the data outputted from the storage space part 212 may be used in the normal operation control part 210 to control the normal operation for the memory 100. In contrast, when the mode selection control signal has a logic level corresponding to the BIRA operation mode, the demultiplexer 216 may enable the second output terminal. In such a case, the data outputted from the storage space part 212 may be used in the BIRA circuit 224 of the repair part 220 to perform the repair operation.

Figure 4:
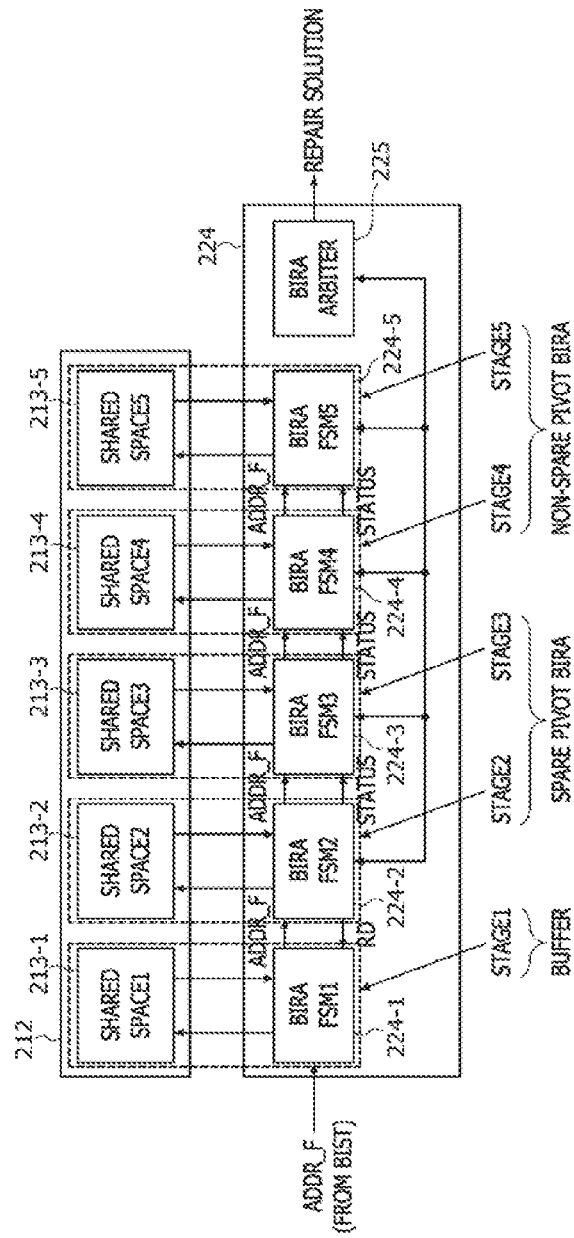
FIG. 4 illustrates an example of a configuration of a built-in redundancy analysis (BIRA) circuit of a repair part for operating a storage space part included in a normal operation control part of a memory controller included in a semiconductor memory device according to an embodiment of the present teachings.

FIG. 4 illustrates an example of a configuration of the BIRA circuit 224 of the repair part 220 for operating the storage space part 212, which is configured to have a pipe-line structure, in the normal operation control part 210 of the memory controller 200 included in the semiconductor memory device 10 according to an embodiment of the present teachings. Referring to FIG. 4, the storage space part 212 in the normal operation control part 210 of the memory controller 200 may include first to fifth shared spaces 213-1, . . . , and 213-5 which are distinct from each other. Although FIG. 4 illustrates an example in which the storage space part 212 includes five shared spaces, the number of the shared spaces is not limited thereto. That is, the number of the shared spaces included in the storage space part 212 may be set to be greater than or less than five according to the embodiments. In an embodiment, each of the first to fifth shared spaces 213-1, . . . , and 213-5 may be the first storage space (212-1 of FIG. 3) or the second storage space (212-2 of FIG. 3) which is described with reference to FIG. 3. Accordingly, each of the first to fifth shared spaces 213-1, . . . , and 213-5 may be a register or an SRAM.

In another embodiment, each of the first to fifth shared spaces 213-1, . . . , and 213-5 may be comprised of a combination of some among the storage spaces (212-1, 212-2, . . . of FIG. 3) in the storage space part 212 of the normal operation control part (210 of FIG. 3). For example, the first shared space 213-1 may be comprised of a combination of the first and second storage spaces 212-1 and 212-2. In yet another embodiment, the first to fifth shared spaces 213-1, . . . , and 213-5 may be comprised of the storage spaces (212-1, 212-2, . . . of FIG. 3) which are logically separated from each other. For example, the first storage space (212-1 of FIG. 3) may be logically divided into the first shared space 213-1 and the second shared space 213-2.

The BIRA circuit 224 of the repair part (220 of FIG. 1) may be configured to include a plurality of BIRA finite state machines (e.g., first to fifth BIRA FSMs 224-1, 224-2, . . . , and 224-5) and a BIRA arbiter 225. In an embodiment, the number of the BIRA FSMs 224-1, 224-2, . . . , and 224-5 disposed in the BIRA circuit 224 may be equal to the number of the shared spaces 213-1, . . . , and 213-5 constituting the storage space part 212 of the normal operation control part (210 of FIG. 1). As illustrated by dotted lines in FIG. 4, one of the first to fifth BIRA FSMs 224-1, 224-2, . . . , and 224-5 and one of the shared spaces 213-1, . . . , and 213-5 may constitute one stage. For example, the first BIRA FSM 224-1 receiving a faulty address ADDR_F from the BIST circuit (222 of FIG. 1) may constitute a first stage STAGE1 together with the first shared space 213-1. In addition, the second BIRA FSM 224-2 and the second shared space 213-2 may constitute a second stage STAGE2, and the third BIRA FSM 224-3 and the third shared space 213-3 may constitute a third stage STAGE3. Moreover, the fourth BIRA FSM 224-4 and the fourth shared space 213-4 may constitute a fourth stage STAGE4, and the fifth BIRA FSM 224-5 and the fifth shared space 213-5 may constitute a fifth stage STAGE5.

A BIRA FSM included in a certain stage among the first to fifth stages STAGE1~STAGE5 may read out data (e.g., the faulty address ADDR_F) stored in a shared space included in the certain stage to receive the data from the shared space included in the certain stage. In addition, a BIRA FSM included in a certain stage among the first to fifth stages STAGE1~STAGE5 may transmit data (e.g., the faulty address ADDR_F) to a shared space included in the certain stage to write the data into the shared space included in the certain stage. That is, a BIRA FSM included in one stage is not able to perform a read operation or a write operation for shared spaces included in the other stages. For example, the first BIRA FSM 224-1 of the first stage STAGE1 may perform the write operation to store the faulty address ADDR_F only into the first shared space 213-1 of the first stage STAGE1 and may perform the read operation to receive only the faulty address ADDR_F stored in the first shared space 213-1 of the first stage STAGE1. Similarly, the second BIRA FSM 224-2 of the second stage STAGE2 may perform the write operation to store the faulty address ADDR_F only into the second shared space 213-2 of the second stage STAGE2 and may perform the read operation to receive only the faulty address ADDR_F stored in the second shared space 213-2 of the second stage STAGE2.

In the present embodiment, the first to fifth stages STAGE1, . . . , and STAGE5 may be sequentially and serially arrayed between an input terminal and an output terminal of the BIRA circuit 224 to have a pipe-line structure. In an embodiment, the first stage STAGE1 directly coupled to the input terminal of the BIRA circuit 224 may be used as a buffer. The semiconductor memory device 10 according to the present embodiment does not use a content addressable memory (CAM) but use the storage spaces (e.g., registers or SRAMs) in the normal operation control part (210 of FIG. 1) as a storage element of the faulty address during the repair operation. Thus, it may be necessary to temporarily store the faulty address ADDR_F outputted from the BIST circuit (222 of FIG. 1) until a BIRA operation in the BIRA operation mode terminates in the remaining stages (i.e., the second to fifth stages STAGE2~STAGE5) coupled to the first stage STAGE1 in series. In an embodiment, the first shared space 213-1 of the first stage STAGE1 may be realized with a buffer processing data according to a first-in first-out (FIFO) algorithm that the data are outputted in the same sequence as the data are inputted. The first BIRA FSM 224-1 of the first stage STAGE1 may receive the faulty address ADDR_F from the BIST circuit (222 of FIG. 1) of the repair part 220 and may output the faulty address ADDR_F to the first shared space 213-1 to store the faulty address ADDR_F into the first shared space 213-1. The first BIRA FSM 224-1 may output the faulty address ADDR_F, which is inputted to and stored in the first BIRA FSM 224-1 firstly, in response to a read request signal RD outputted from the second BIRA FSM 224-2 of the second stage STAGE2.

The faulty address ADDR_F outputted from the first BIRA FSM 224-1 may be inputted to the second BIRA FSM 224-2 of the second stage STAGE2 corresponding to the next stage. The second BIRA FSM 224-2 may perform the BIRA operation using the second shared space 231-2. If the BIRA operation is performed by the second BIRA FSM 224-2, the second BIRA FSM 224-2 may output the faulty address ADDR_F and a status signal STATUS. In such a case, the faulty address ADDR_F may correspond to a target address of the BIRA operation performed by the second BIRA FSM 224-2, and the status signal STATUS may correspond to a status after the BIRA operation of the second BIRA FSM 224-2. The faulty address ADDR_F and the status signal STATUS outputted from the second BIRA FSM 224-2 may be inputted to the third BIRA FSM 224-3 of the third stage STAGE3.

The third BIRA FSM 224-3 may perform the same operation as the BIRA operation executed by the second BIRA FSM 224-2, which is described above. Thus, the faulty address ADDR_F and the status signal STATUS may be transmitted from the third BIRA FSM 224-3 to the fourth BIRA FSM 224-4. Similarly, the fourth BIRA FSM 224-4 may also perform the BIRA operation, and the faulty address ADDR_F and the status signal STATUS may be transmitted from the fourth BIRA FSM 224-4 to the fifth BIRA FSM 224-5 after the fourth BIRA FSM 224-4 performs the BIRA operation. The BIRA operations performed by the second to fifth BIRA FAMs 224-2, . . . , and 224-5 may be set to be different according a BIRA algorithm. In an embodiment, the second and third stages STAGE2 and STAGE3 may be configured to perform the BIRA operation for a spare pivot. In addition, the fourth and fifth stages STAGE4 and STAGE5 may be configured to perform the BIRA operation for a non-spare pivot. The BIRA operation for the spare pivot and the BIRA operation for the non-spare pivot will be described in detail hereinafter.

If a test operation performed by the BIST circuit (222 of FIG. 1) terminates and the BIRA operations performed by the second to fifth BIRA FSMs 224-2, . . . , and 224-5 terminate, a redundancy analysis (RA) operation may be performed. In an embodiment, the RA operation may be performed by the BIRA arbiter 225 of the BIRA circuit 224. The BIRA arbiter 225 may grasp distribution of the faulty addresses ADDR_F which are stored in the second to fifth shared spaces 213-2, . . . , and 213-5 through the second to fifth BIRA FSMs 224-2, . . . , and 224-5. In addition, the BIRA arbiter 225 may determine an appropriate repair solution based on the distribution of the faulty addresses ADDR_F and may output the repair solution. A method for determining the repair solution may be different according to a repair algorithm employed in the semiconductor memory device 10.

Figure 5:
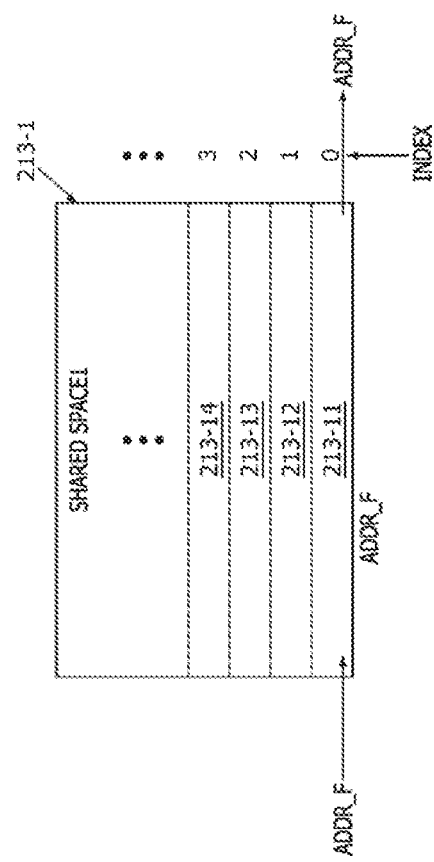
FIG. 5 illustrates an example of a configuration of a first shared space for a repair operation of a semiconductor memory device according to an embodiment of the present teachings.

FIG. 5 illustrates an example of a configuration of the first shared space 213-1 included in the storage space part 212 of the semiconductor memory device 10 according to an embodiment of the present teachings. Referring to FIG. 5, the first shared space 213-1 of the first stage STAGE1 may have a plurality of storage regions 213-11, 213-12, 213-13, . . . . In an embodiment, the plurality of storage regions 213-11, 213-12, 213-13, . . . may be distinguished by an index INDEX. The faulty addresses ADDR_F may be stored in the storage regions 213-11, 213-12, 213-13, . . . , respectively. In addition, the faulty addresses ADDR_F stored in the storage regions 213-11, 213-12, 213-13, . . . of the first shared space 213-1 may be sequentially outputted under a predetermined condition. The faulty addresses ADDR_F may be inputted to and outputted from the first shared space 213-1 in response to status change of the first BIRA FSM 224-1.

Figure 6:
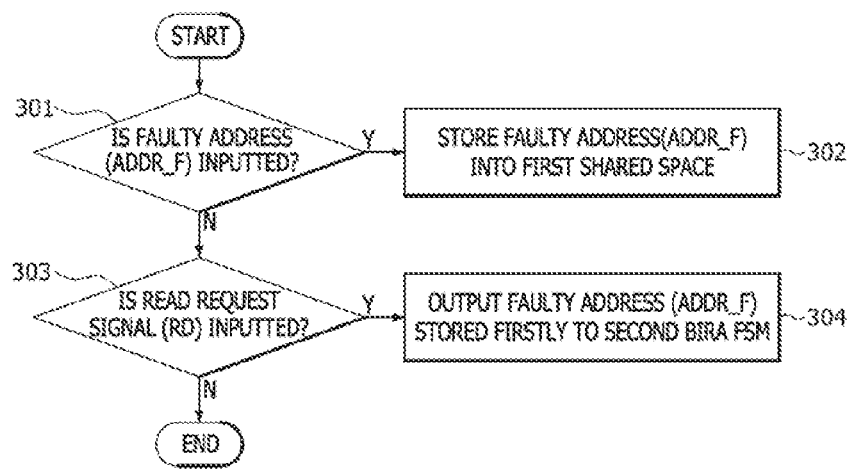
FIG. 6 is a flowchart illustrating an operation of a first BIRA finite state machine (FSM) of a BIRA circuit during a repair operation of a semiconductor memory device according to an embodiment of the present teachings.

FIG. 6 is a flowchart illustrating a status change operation of the first BIRA FSM 224-1 of the first stage STAGE1 included in the semiconductor memory device 10 according to an embodiment of the present teachings. Referring to FIGS. 4, 5, and 6, the first BIRA FSM 224-1 may determine whether the faulty address ADDR_F is transmitted from the BIST circuit 222 to the first BIRA FSM 224-1 (see step 301). If the faulty address ADDR_F is inputted to the first BIRA FSM 224-1, the faulty address ADDR_F may be stored into the first shared space 213-1 (see step 302). In an embodiment, the faulty address ADDR_F may be stored into a storage region having a lowest index among empty storage regions in the first shared space 213-1. In such a case, pointers defining a storage sequence may be assigned to the storage regions into which the faulty addresses ADDR_F are stored. If no faulty address ADDR_F is inputted to the first BIRA FSM 224-1 at the step 301, the first BIRA FSM 224-1 may determine whether the read request signal RD is transmitted from the second BIRA FSM 224-2 to the first BIRA FSM 224-1 (see step 303). If the read request signal RD is inputted to the first BIRA FSM 224-1, the first BIRA FSM 224-1 may output the faulty address ADDR_F stored firstly among the faulty addresses ADDR_F stored in the first shared space 213-1 to the second BIRA FSM 224-2 (see step 304). The faulty address ADDR_F stored firstly among the faulty addresses ADDR_F stored in the first shared space 213-1 may be found out using the pointers which are assigned to respective ones of the storage regions 213-11, 213-12, . . . .

Figure 7:
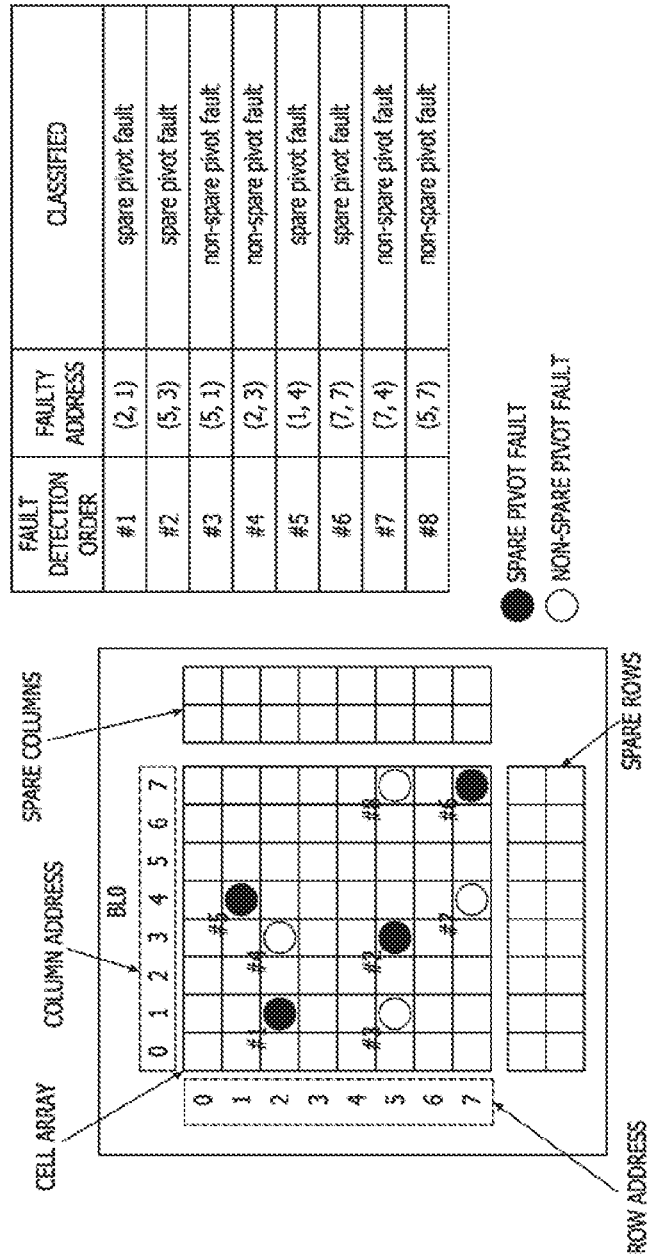
FIG. 7 illustrates a spare pivot fault and a non-spare pivot fault for performing a repair operation of a semiconductor memory device according to an embodiment of the present teachings.

FIG. 7 illustrates a spare pivot fault and a non-spare pivot fault for performing the repair operation of the semiconductor memory device 10 according to an embodiment of the present teachings. In the present embodiment, it may be assumed that the first memory block BL0 of the memory 100 described with reference to FIG. 2 is tested and repaired. The following description for the first memory block BL0 may be equally applied to each of the other memory blocks BL1, BL2, . . . . Referring to FIG. 7, it may be assumed that the first memory block BL0 includes a cell array having eight rows and eight columns, two spare rows, and two spare columns, as described with reference to FIG. 2. In addition, it may be assumed that eight faulty cells (indicated by empty circles and filled circles) are detected while the first memory block BL0 is tested by the BIST circuit 222. A detection order of the faulty cells is indicated by numerals written to be adjacent to respective ones of the faulty cells. If the faulty cells are detected by the BIST circuit 222, addresses (i.e., the faulty addresses) of the faulty cells may be transmitted to the BIRA circuit 224 in real time.

In the present embodiment, the faulty cells may be categorized as either spare pivots or non-spare pivots. Each of the spare pivots may be defined as a faulty cell having a row address and a column address which are different from addresses (i.e., faulty addresses) of faulty cells that are previously detected. In contrast, each of the non-spare pivots may be defined as a faulty cell having an address which is the same as at least one of a row address and a column address of a faulty cell that is previously detected. For example, a first faulty cell (denoted by a symbol "#1") having a row address of "2" and a column address of "1" (hereinafter, expressed in a form of (2,1)), which is detected firstly, may be a spare pivot. A second fault cell (denoted by a symbol "#2") having an address (5,3) may also be a spare pivot because the row address "5" of the second faulty cell is different from the row address "2" of the first fault cell detected previously and the column address "3" of the second faulty cell is different from the column address "1" of the first fault cell detected previously. In contrast, a third faulty cell (denoted by a symbol "#3") has a column address "1" which is the same as the column address of the first faulty cell detected previously and has a row address "5" which is the same as the row address of the second faulty cell detected previously. Thus, the third faulty cell having an address (5,1) may correspond to a non-spare pivot. According to the same way as described above, a fifth faulty cell (denoted by a symbol "#5") having an address (1,4) and a sixth faulty cell (denoted by a symbol "#6") may correspond to spare pivots. In contrast, a fourth faulty cell (denoted by a symbol "#4") having an address (2,3), a seventh faulty cell (denoted by a symbol "#7") having an address (7,4), and an eighth faulty cell (denoted by a symbol "#8") having an address (5,7) may correspond to non-spare pivots.

The non-spare pivot may have a cross status with respect to the spare pivots or a non-cross status with respect to the spare pivots. The non-spare pivot having the cross status may be defined as the non-spare pivot having a row address identical to at least one of the row addresses of the spare pivots detected previously and a column address identical to at least one of the column addresses of the spare pivots detected previously. Thus, a row address of the non-spare pivot having the cross status may be the same as one of the row addresses of the spare pivots detected previously, and a column address of the non-spare pivot having the cross status may be the same as one of the column addresses of the spare pivots detected previously. In contrast, the non-spare pivot having the non-cross status may be defined as the non-spare pivot having a row address identical to at least one of the row address of the spare pivots detected previously and a column address different from the column addresses of the spare pivots detected previously or may be defined as the non-spare pivot having a row address different from the row addresses of the spare pivots detected previously and a column address identical to at least one of the column address of the spare pivots detected previously. Thus, only one of a row address and a column address of the non-spare pivot having the non-cross status may be identical to at least one of the row addresses of the spare pivots detected previously or may be identical to at least one of the column addresses of the spare pivots.

Figure 8:
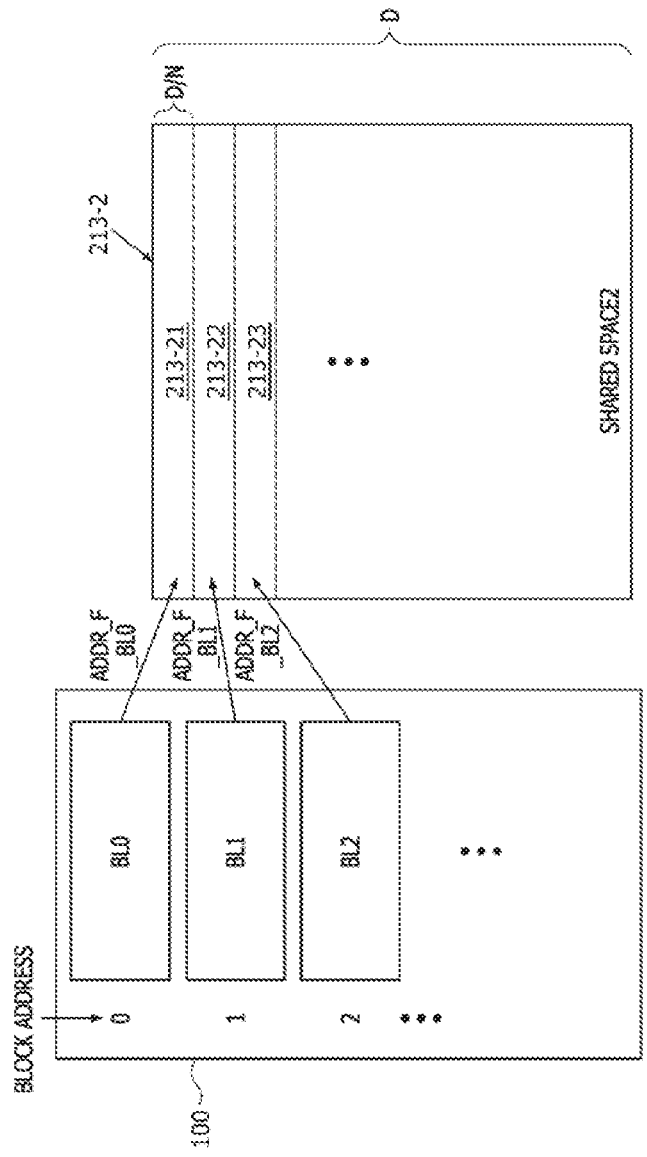
FIG. 8 illustrates an example of a configuration of a second shared space of a second stage during a repair operation of a semiconductor memory device according to an embodiment of the present teachings.

FIG. 8 illustrates an example of a configuration of the second shared space 213-2 of the second stage STAGE2 during the repair operation of the semiconductor memory device 10 according to an embodiment of the present teachings. As described with reference to FIG. 4, both of the second and third stages STAGE2 and STAGE3 may perform the BIRA operation for the spare pivots. Thus, the BIRA operation performed in the second stage STAGE2 will be described hereinafter, and the BIRA operation performed in the second stage STAGE2 may also be equally applied to the third stage STAGE3. Referring to FIG. 8, the second shared space 213-2 having a storage capacity "D" may be divided into "N"-number of storage regions (i.e., first to $N^{th}$ storage regions 213-21, 213-22, 213-23, . . . and 213-2N. Thus, each of the first to $N^{th}$ storage regions 213-21, 213-22, 213-23, . . . , and 213-2N may have a storage capacity "D/N." The second shared space 213-2 may be configured to store the faulty addresses ADDR_F detected from one of the plurality of memory blocks BL0, BL1, BL2, . . . constituting the memory 100 into any one of the storage regions 213-21, 213-22, 213-23, . . . , and 213-2N. For example, faulty addresses ADDR_F_BL0 detected from the first memory block BL0 may be stored into the first storage region 213-21, and faulty addresses ADDR_F_BL1 detected from the second memory block BL1 may be stored into the second storage region 213-22. Similarly, faulty addresses ADDR_F_BL2 detected from the third memory block BL2 may be stored into the third storage region 213-23.

Figure 9:
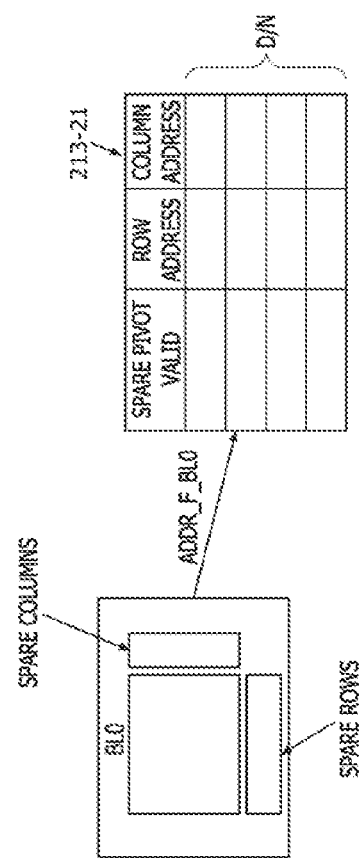
FIG. 9 illustrates an example of a data storage form in a first storage region of the second shared space illustrated in FIG. 8.

FIG. 9 illustrates an example of a data storage form in the first storage region 213-21 of the second shared space 213-2 illustrated in FIG. 8. As described with reference to FIG. 8, the faulty addresses ADDR_F_BL0 detected from the first memory block BL0 of the memory 100 may be stored into the first storage region 213-21. As illustrated in FIG. 9, spare pivot valid data, row addresses, and column addresses may be stored into the first storage region 213-21. Each of the spare pivot valid data may have a logic "0" level or a logic "1" level. If a certain datum of the spare pivot valid data has a logic "1" level, the faulty cell having the row address and the column address of the certain datum may be a valid spare pivot. That is, the row address and the column address of the spare pivot valid data having a logic "1" level may correspond to the row address and the column address of the spare pivot. The number of the spare pivots in the first storage region 213-21 in which the faulty addresses ADDR_F_BL0 are stored may be determined according to the number of the spare rows and the number of the spare columns in the first memory block BL0. If the first memory block BL0 has "R"-number of spare rows and "C"-number of spare columns, the number of the spare pivots in the first storage region 213-21 stored in which the faulty addresses ADDR_F_BL0 are stored may be restricted to be "R×C." In the present embodiment, it may be assumed that the first memory block BL0 has two spare rows and two spare columns. In such a case, the number of the spare pivots in the first storage region 213-21 stored in which the faulty addresses ADDR_F_BL0 are stored may be restricted to be "4."

Figure 10:
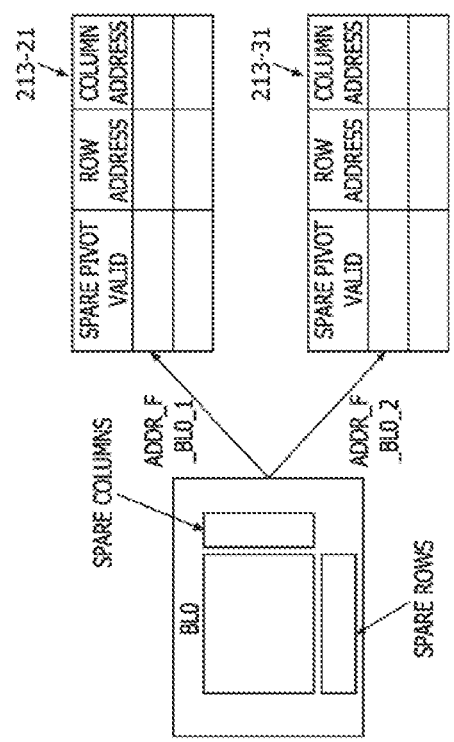
FIG. 10 illustrates an example of a method of storing faulty addresses into a shared space during a repair operation of a semiconductor memory device according to an embodiment of the present teachings.

FIG. 10 illustrates an example of a method of storing the faulty addresses into the shared space during the repair operation of the semiconductor memory device 10 according to an embodiment of the present teachings. Referring to FIG. 10, the faulty addresses of the faulty cells detected from one (e.g., the first memory block BL0) of the memory blocks constituting the memory 100 may be divided into two groups of the faulty addresses and may be stored into the second shared space 212-2 of the second stage STAGE2 and the third shared space 212-3 of the third stage STAGE3. Some clock signals may be required to perform the BIRA operation in each of the stages disposed to have a pipe-line structure. That is, the number of clock signals required to perform the BIRA operation for the first memory block BL0 in the second stage STAGE2 may be proportional to an amount of data stored in the first storage region 213-21 of the second shared space 213-2. This is because data stored in the first storage region 213-21 of the second shared space 213-2 have to be read out and the read data have to be compared with the faulty address inputted to the second stage STAGE2, in order to perform the BIRA operation for the first memory block BL0. Thus, according to the present embodiment, the number of the clock signals required to perform the BIRA operation in each stage may be reduced by dividing a storage region for storing the faulty addresses of the spare pivots of the first memory block BL0 into the first storage region 213-21 of the second shared space 213-2 included in the second stage STAGE2 and the first storage region 213-31 of the third shared space 213-3 included in the third stage STAGE3. In an embodiment, in the event that the first memory block BL0 has "R"-number of spare rows and "C"-number of spare columns, "(R×C)/2"-number of the faulty addresses may be stored in the first storage region 213-21 of the second shared space 213-2 and "(R×C)/2"-number of the faulty addresses may be stored in the first storage region 213-31 of the third shared space 213-3.

Figure 11:
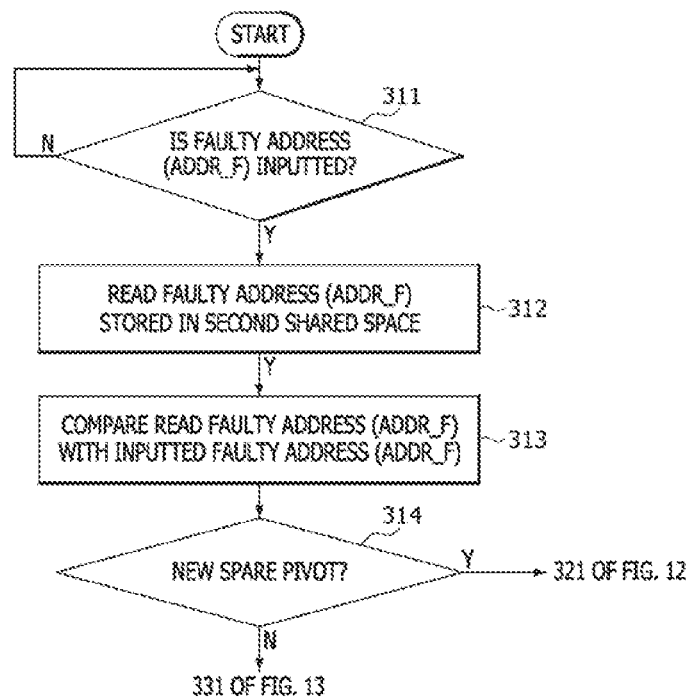
FIGS. 11 to 13 are flowcharts illustrating an operation of a second BIRA FSM of a BIRA circuit during a repair operation of a semiconductor memory device according to an embodiment of the present teachings.
Figure 12:
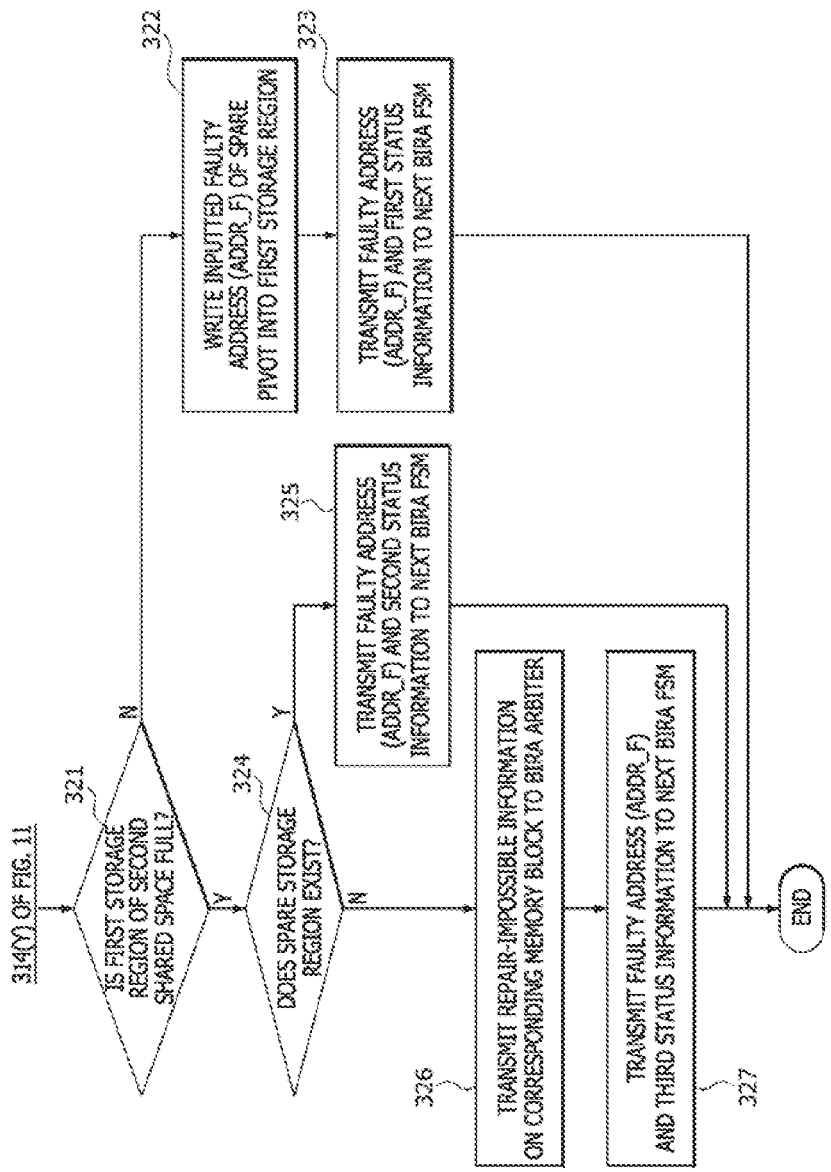
Figure 13:
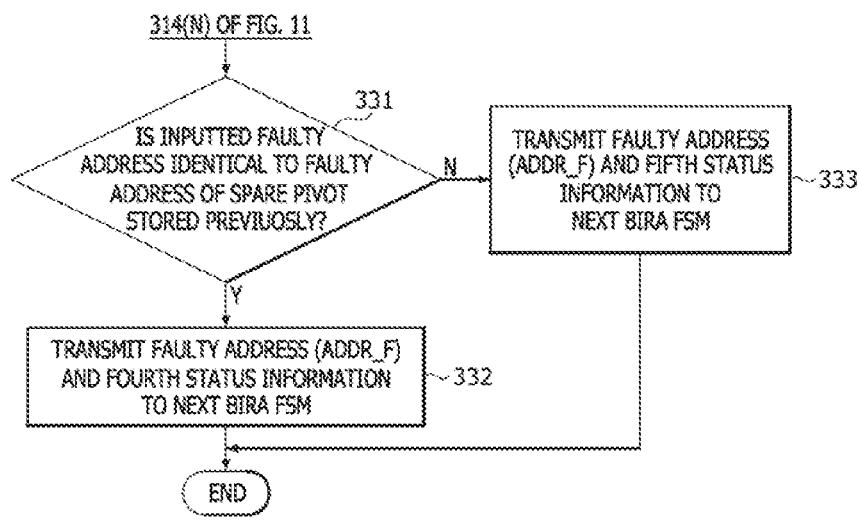

FIGS. 11 to 13 are flowcharts illustrating an operation of the second BIRA FSM 224-2 of the BIRA circuit 224 during the repair operation of the semiconductor memory device 10 according to an embodiment of the present teachings. First, referring to FIGS. 4 and 11, the second BIRA FSM 224-2 may determine whether the faulty address ADDR_F is inputted to the second BIRA FSM 224-2 (see step 311). The faulty address ADDR_F may be transmitted from the first BIRA FSM 224-1 of the first stage STAGE1 functioning as a buffer to the second BIRA FSM 224-2 of the second stage STAGE2. If the faulty address ADDR_F is inputted to the second BIRA FSM 224-2 at the step 311, the second BIRA FSM 224-2 may determine whether the faulty cell having the inputted faulty address ADDR_F is a spare pivot. In order to determine whether the faulty cell having the inputted faulty address ADDR_F is a spare pivot, the faulty addresses ADDR_F stored in the second shared space 213-2 may be read out (see step 312). The read faulty addresses ADDR_F may be compared with the inputted faulty address ADDR_F (see step 313). Whether the faulty cell having the inputted faulty address ADDR_F is a spare pivot may be determined (see step 314). The discrimination of the step 314 may be executed according to the comparison result of the step 313. That is, if a row address of the inputted faulty address ADDR_F is different from the row addresses of the read faulty addresses ADDR_F and a column address of the inputted faulty address ADDR_F is different from the column addresses of the read faulty addresses ADDR_F at the step 313, the faulty cell having the inputted faulty address ADDR_F may be regarded as a new spare pivot at the step 314. In such a case, a step 321 of FIG. 12 may be executed. In contrast, if at least one of the row address and the column address of the inputted faulty address ADDR_F is identical to any one of the row addresses of the read faulty addresses ADDR_F or any one of the column addresses of the read faulty addresses ADDR_F, the faulty cell having the inputted faulty address ADDR_F may be regarded as a non-spare pivot at the step 314. In such a case, a step 331 of FIG. 13 may be executed.

Referring to FIG. 12, if the faulty cell having the inputted faulty address ADDR_F is determined as a spare pivot at the step 314, whether the first storage region 213-21 of the second shared space 213-2 is full of the faulty addresses ADDR_F may be determined (see step 321). If the first storage region 213-21 of the second shared space 213-2 is not full of the faulty addresses ADDR_F (i.e., the first storage region 213-21 has an empty region in which the inputted faulty address ADDR_F can be stored) at the step 321, the inputted faulty address ADDR_F of the spare pivot may be written into the first storage region 213-21 (see step 322). As described with reference to FIG. 9, a data of "1" corresponding to the spare pivot valid data, a row address of the inputted faulty address ADDR_F of the spare pivot, and a column address of the inputted faulty address ADDR_F of the spare pivot may be stored in the first storage region 213-21. The faulty address ADDR_F and a first status information (corresponding to a status information on the second BIRA FSM 224-2) may be transmitted to the next BIRA FSM (i.e., the third BIRA FSM 224-3) (see step 323). The first status information may include information about that a new spare pivot of the first memory block BL0 is stored in the first storage region 213-21.

If the first storage region 213-21 of the second shared space 213-2 is full of the faulty addresses ADDR_F at the step 321, whether a spare storage region exists may be determined (see step 324). The discrimination of the step 324 may be executed when the faulty addresses of the spare pivots detected from one memory block are stored into a plurality of shared spaces. For example, as described with reference to FIG. 10, the faulty addresses of the spare pivots detected from the first memory block BL0 may be classified into two groups of the faulty addresses (i.e., a first group of faulty addresses ADDR_F_BL0_1 and a second group of faulty addresses ADDR_F_BL0_2), and the first group of faulty addresses ADDR_F_BL0_1 may be stored into the second shared space 213-2 and the second group of faulty addresses ADDR_F_BL0_2 may be stored into the third shared space 213-3. In such a case, although the first storage region 213-21 of the second shared space 213-2 is full of the faulty addresses of the spare pivots detected from the first memory block BL0, the third shared space 213-3 may still have a spare space into which the faulty addresses of the spare pivots detected from the first memory block BL0 can be stored.

As described above, if the spare storage region exists at the step 324, the inputted faulty address ADDR_F of the spare pivot and a second status information (corresponding to a status information on the second BIRA FSM 224-2) may be transmitted to the next BIRA FSM (i.e., the third BIRA FSM 224-3) (see step 325). The second status information may include information about that the faulty address of the spare pivot can be stored in a shared space of another stage. If the spare storage region does not exist at the step 324 (i.e., there is no spare space for storing the inputted faulty address ADDR_F of the spare pivot), it means that the faulty cell having the inputted faulty address cannot be repaired because no spare space exists. Thus, in such a case, repair-impossible information on the first memory block BL0 may be transmitted to the BIRA arbiter (225 of FIG. 4) (see step 326), and the inputted faulty address ADDR_F of the spare pivot and a third status information (corresponding to a status information on the second BIRA FSM 224-2) may be transmitted to the next BIRA FSM (i.e., the third BIRA FSM 224-3) (see step 327). The third status information may include the repair-impossible information on the first memory block BL0.

Referring to FIG. 13, if the faulty cell having the inputted faulty address ADDR_F is not the spare pivot at the step 314, the faulty cell having the inputted faulty address ADDR_F may correspond to the non-spare pivot. In such a case, the second BIRA FSM 224-2 may determine whether a row address of the inputted faulty address ADDR_F is identical to at least one of the row addresses of the faulty addresses ADDR_F of the spare pivots previously stored in the second shared space 213-2 and a column address of the inputted faulty address ADDR_F is identical to at least one of the column addresses of the faulty addresses ADDR_F of the spare pivots previously stored in the second shared space 213-2 at the step 331. This is for discriminating whether the non-spare pivot has the cross status. If the non-spare pivot having the inputted faulty address ADDR_F is regarded as having a cross status at the step 331, the inputted faulty address ADDR_F of the non-spare pivot and a fourth status information (corresponding to a status information on the second BIRA FSM 224-2) may be transmitted to the next BIRA FSM (i.e., the third BIRA FSM 224-3) (see step 332). The fourth status information may include information about that the faulty cell having the inputted faulty address ADDR_F corresponds to the non-spare pivot having a cross status. If only one of the row address and the column address of the inputted faulty address ADDR_F is identical to at least one of the row addresses of the faulty addresses ADDR_F of the spare pivots stored in the second shared space 213-2 or at least one of the column addresses of the faulty addresses ADDR_F of the spare pivots stored in the second shared space 213-2 at the step 331 (i.e., the faulty cell having the inputted faulty address ADDR_F is a non-spare pivot having a non-cross status) at the step 331, the inputted faulty address ADDR_F of the non-spare pivot and a fifth status information (corresponding to a status information on the second BIRA FSM 224-2) may be transmitted to the next BIRA FSM (i.e., the third BIRA FSM 224-3) (see step 333). The fifth status information may include information about that the faulty cell having the inputted faulty address ADDR_F corresponds to the non-spare pivot having a non-cross status.

The third stage STAGE3 may also perform substantially the same BIRA operation as described with reference to FIGS. 11 to 13. However, the third stage STAGE3 may transmit only the faulty address ADDR_F and the status information STATUS to the fourth BIRA FSM 224-4 without execution of any extra operation according to the status information STATUS outputted from the second BIRA FSM 224-2 of the second stage STAGE2. For example, if the status information STATUS outputted from the second BIRA FSM 224-2 is any one of the first status information, the third status information, the fourth status information, and the fifth status information, the third BIRA FSM 224-3 of the third stage STAGE3 may transmit the faulty address ADDR_F and the status information STATUS to the fourth BIRA FSM 224-4 without execution of the BIRA operation described with reference to FIGS. 11 to 13. In contrast, if the status information STATUS outputted from the second BIRA FSM 224-2 is the second status information, the third BIRA FSM 224-3 of the third stage STAGE3 may perform the steps 322 and 323 illustrated in FIG. 12 because the first storage region is not full of the faulty addresses at the step 321 of FIG. 12.

Figure 14:
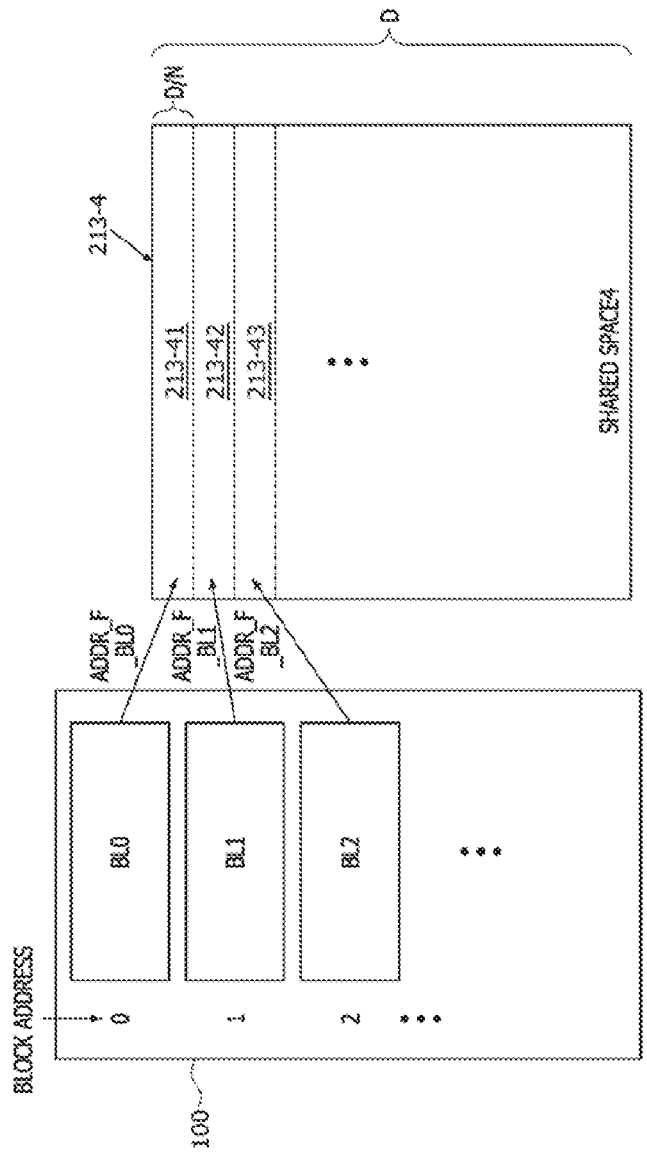
FIG. 14 illustrates an example of a configuration of a fourth shared space of a fourth stage during a repair operation of a semiconductor memory device according to an embodiment of the present teachings.

FIG. 14 illustrates an example of a configuration of the fourth shared space 213-4 of the fourth stage STAGE4 during the repair operation of the semiconductor memory device 10 according to an embodiment of the present teachings. As described with reference to FIG. 4, both of the fourth and fifth stages STAGE4 and STAGE5 may perform the BIRA operation for the non-spare pivot. Thus, the BIRA operation performed by the fourth stage STAGE4 will be described hereinafter, and the BIRA operation performed by the fourth stage STAGE4 may be equally applied to the fifth stage STAGE5. Referring to FIG. 14, the fourth shared space 213-4 having a storage capacity "D" may be divided into "N"-number of storage regions (i.e., first to $N^{th}$ storage regions 213-41, 213-42, 213-43, . . . , and 213-4N. Thus, each of the first to $N^{th}$ storage regions 213-41, 213-42, 213-43, . . . , and 213-4N may have a storage capacity "D/N." The fourth shared space 213-4 may be configured to store the faulty addresses ADDR_F detected from one of the plurality of memory blocks BL0, BL1, BL2, . . . constituting the memory 100 into any one of the storage regions 213-41, 213-42, 213-43, . . . , and 213-4N. For example, faulty addresses ADDR_F_BL0 of the non-spare pivots detected from the first memory block BL0 may be stored into the first storage region 213-41, and faulty addresses ADDR_F_BL1 of the non-spare pivots detected from the second memory block BL1 may be stored into the second storage region 213-42. Similarly, faulty addresses ADDR_F_BL2 of the non-spare pivots detected from the third memory block BL2 may be stored into the third storage region 213-43.

Figure 15:
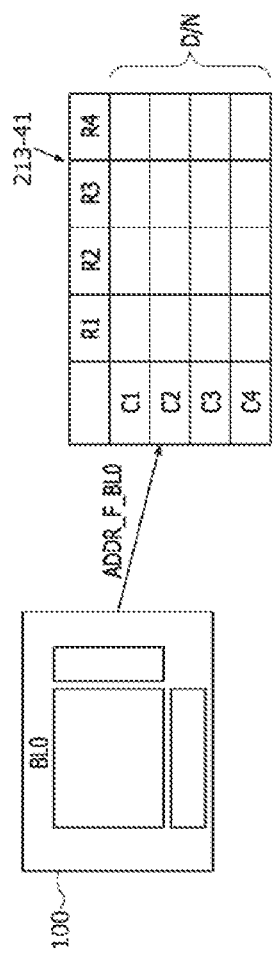
FIG. 15 illustrates an example of a data storage form in a first storage region of the fourth shared space illustrated in FIG. 14.

FIG. 15 illustrates an example of a data storage form in the first storage region 213-41 of the fourth shared space 213-4 illustrated in FIG. 14. As described with reference to FIG. 14, the faulty addresses ADDR_F_BL0 of the non-spare pivots having the cross status among the non-spare pivots detected from the first memory block BL0 of the memory 100 may be stored into the first storage region 213-41. As illustrated in FIG. 15, the faulty addresses ADDR_F_BL0 of the non-spare pivots having the cross status may be stored into the first storage region 213-41 of the fourth shared space 213-4 in a matrix form defined by a plurality of row addresses R1~R4 and a plurality of column addresses C1~C4. The row addresses R1~R4 may be row addresses of the spare pivots detected from the first memory block BL0. The column addresses C1~C4 may be column addresses of the spare pivots detected from the first memory block BL0. Thus, at a point in time when the faulty address ADDR_F_BL0 of the non-spare pivot is transmitted to the fourth BIRA FSM 224-4, none, some, or all of the plurality of row addresses R1~R4 and the plurality of column addresses C1~C4 in the first storage region 213-41 of the fourth shared space 213-4 may be specified according to the number of the spare pivots that are previously detected.

Figure 16:
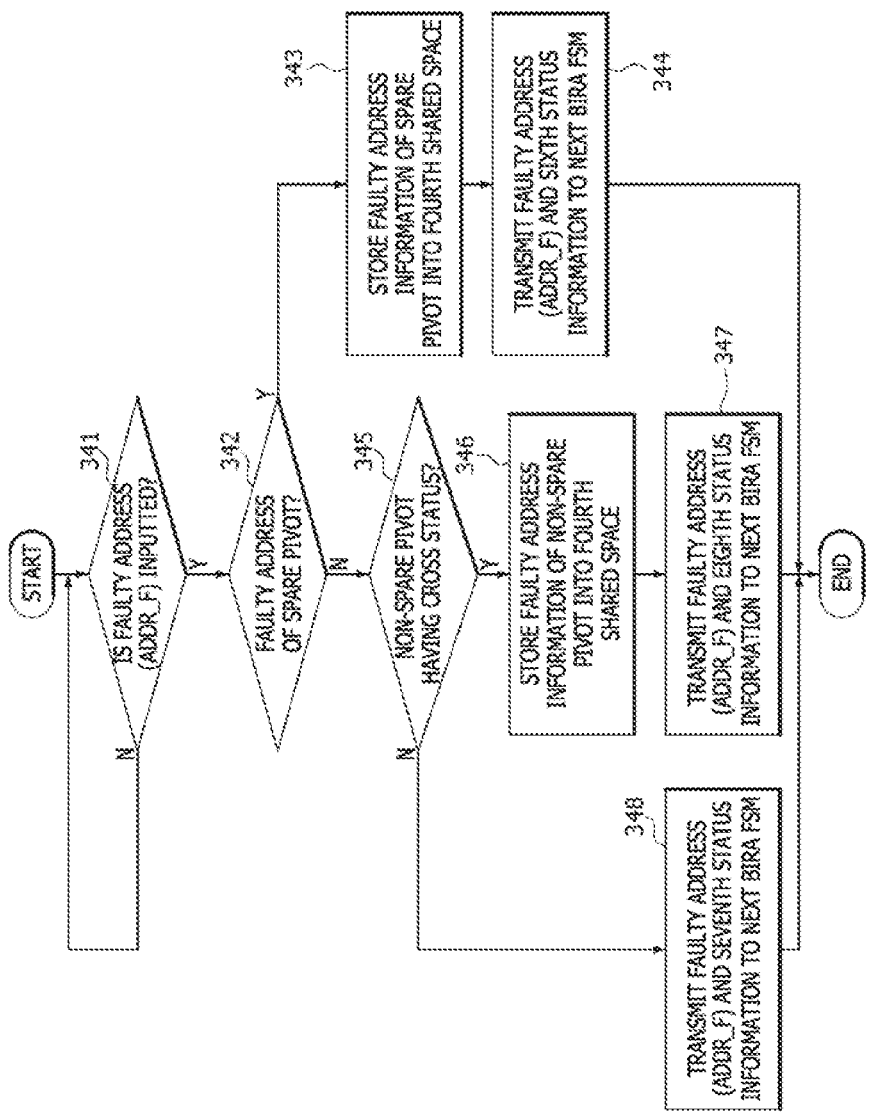
FIG. 16 is a flowchart illustrating an operation of a fourth BIRA FSM of a BIRA circuit during a repair operation of a semiconductor memory device according to an embodiment of the present teachings.

FIG. 16 is a flowchart illustrating an operation of the fourth BIRA FSM 224-4 of the BIRA circuit 224 during the repair operation of the semiconductor memory device 10 according to an embodiment of the present teachings. Referring to FIGS. 4 and 16, the fourth BIRA FSM 224-4 may determine whether the faulty address ADDR_F is inputted to the fourth BIRA FSM 224-4 (see step 341). The faulty address ADDR_F and a status information STATUS may be transmitted from a BIRA FSM of the previous stage (i.e., the third BIRA FSM 224-3 of the third stage STAGE3) to the fourth BIRA FSM 224-4. If the faulty address ADDR_F is inputted to the fourth BIRA FSM 224-4 at the step 341, the fourth BIRA FSM 224-4 may determine whether the inputted faulty address ADDR_F corresponds to the faulty address of the spare pivot (see step 342). The discrimination of the step 342 may be executed according to the status information STATUS outputted from the third BIRA FSM 224-3. As described with reference to FIG. 12, if the status information STATUS outputted from the third BIRA FSM 224-3 is any one of the first status information, the second status information, and the third status information, the faulty address ADDR_F outputted from the third BIRA FSM 224-3 may correspond to the faulty address ADDR_F of the spare pivot. In such a case, the faulty address ADDR_F of the spare pivot may be stored into the first storage region 213-41 of the fourth shared space 213-4 (see step 343). The faulty address ADDR_F of the spare pivot may be stored by the same method as described with reference to FIG. 15. Subsequently, the faulty address ADDR_F and a sixth status information may be transmitted to a next BIRA FSM (i.e., the fifth BIRA FSM of the fifth stage STAGE5) (see step 344). The sixth status information may include information about that the information on the faulty address of the spare pivot is stored into a shared space performing the BIRA operation of non-spare pivot.

As described with reference to FIG. 13, if the status information STATUS outputted from the third BIRA FSM 224-3 is the fourth status information or the fifth status information, the faulty address ADDR_F outputted from the third BIRA FSM 224-3 may correspond to the faulty address ADDR_F of the non-spare pivot. That is, the faulty address ADDR_F outputted from the third BIRA FSM 224-3 may be regarded as the faulty address of the non-spare pivot at the step 342. In such a case, whether the non-spare pivot has a cross status may be determined (see step 345). If the status information STATUS outputted from the third BIRA FSM 224-3 is the fourth status information, the faulty address outputted from the third BIRA FSM 224-3 may correspond to the faulty address of the non-spare pivot having the cross status. In such a case, the faulty address of the non-spare pivot may be stored into the first storage region 213-41 of the fourth shared space 213-4 (see step 346). Subsequently, the faulty address ADDR_F and an eighth status information may be transmitted to a next BIRA FSM (i.e., the fifth BIRA FSM of the fifth stage STAGE5 (see step 347). The eighth status information may be the same as the fourth status information outputted from the third BIRA FSM 224-3.

If the status information STATUS outputted from the third BIRA FSM 224-3 is the fifth status information, the faulty address ADDR_F outputted from the third BIRA FSM 224-3 may correspond to the faulty address ADDR_F of the non-spare pivot having a non-cross status. That is, the faulty address ADDR_F outputted from the third BIRA FSM 224-3 may be regarded as the faulty address of the non-spare pivot having the non-cross status at the step 345. In such a case, the faulty address ADDR_F and a seventh status information may be transmitted to a next BIRA FSM (i.e., the fifth BIRA FSM of the fifth stage STAGE5) (see step 348). The seventh status information may be the same as the fifth status information outputted from the third BIRA FSM 224-3.

Figure 17:
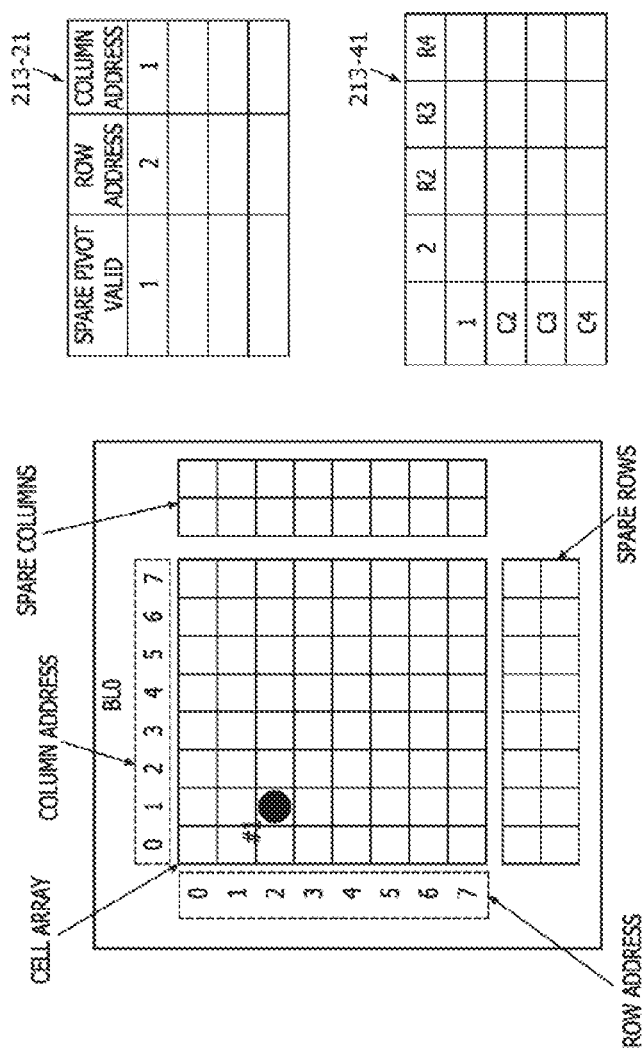
FIGS. 17 to 25 illustrate a repair method of a semiconductor memory device according to an embodiment of the present teachings.

FIGS. 17 to 25 illustrate a repair method of the semiconductor memory device 10 according to an embodiment of the present teachings. In each of FIGS. 17 to 24, the first memory block BL0 is illustrated at a left side, the first storage region 213-21 of the second shared space 213-2 for the BIRA operation for the spare pivots is illustrated at an upper-right side, and the first storage region 213-41 of the fourth shared space 213-4 for the BIRA operation for the non-spare pivots having the cross status is illustrated at a lower-right side. As illustrated in FIG. 17, it may be assumed that the faulty cell having a faulty address (2,1) is firstly tested while the first memory block BL0 is tested by the BIST circuit (222 of FIG. 1). In such a case, the BIST circuit 222 may output the faulty address (2,1) of the faulty cell to the BIRA circuit (224 of FIG. 1). The faulty address (2,1) may be temporarily stored into the first shared space 213-1 by a control operation of the first BIRA FSM 224-1 of the BIRA circuit 224 and may then be transmitted to the second BIRA FSM 224-2 of the BIRA circuit 224.

The faulty cell having the faulty address (2,1) may correspond to the spare pivot. The second BIRA FSM 224-2 may operate to store the spare pivot valid data of "1," the row address of "2," and the column address of "1" into the first storage region 213-21 of the second shared space 213-2. In addition, the second BIRA FSM 224-2 may transmit the faulty address (2,1) and the first status information to the third BIRA FSM 224-3. The third BIRA FSM 224-3 may transmit the faulty address (2,1) and the first status information to the fourth BIRA FSM 224-4 without execution of any extra operation because the faulty address (2,1) of the spare pivot has been already stored in the first storage region 213-21 of the second shared space 213-2. The fourth BIRA FSM 224-4 may operate to store the faulty address (2,1) of the spare pivot into the first storage region 213-41 of the fourth shared space 213-4. Thus, "2" and "1" may be recorded as the first row address R1 and the first column address C1 of the first storage region 213-41 of the fourth shared space 213-4, respectively.

Figure 18:
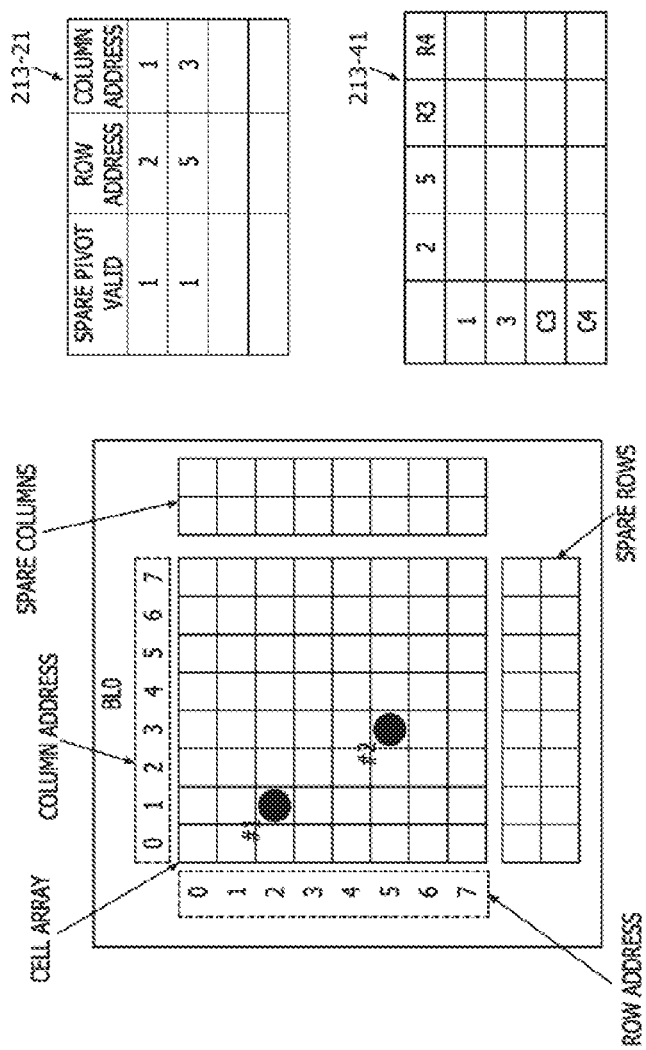

Next, as illustrated in FIG. 18, it may be assumed that the faulty cell having a faulty address (5,3) is secondly tested while the first memory block BL0 is tested by the BIST circuit (222 of FIG. 1). In such a case, the BIST circuit 222 may output the faulty address (5,3) of the faulty cell to the BIRA circuit (224 of FIG. 1). The faulty address (5,3) may be temporarily stored into the first shared space 213-1 by a control operation of the first BIRA FSM 224-1 of the BIRA circuit 224 and may then be transmitted to the second BIRA FSM 224-2 of the BIRA circuit 224. Because the row address "5" and the column address "3" of the faulty address (5,3) are different from the row address "2" and the column address "1" of the first faulty cell, the faulty cell having the faulty address (5,3) may correspond to the spare pivot. The second BIRA FSM 224-2 may operate to store the spare pivot valid data of "1," the row address of "5," and the column address of "3" into the first storage region 213-21 of the second shared space 213-2. In addition, the second BIRA FSM 224-2 may transmit the faulty address (5,3) and the first status information to the third BIRA FSM 224-3. The third BIRA FSM 224-3 may transmit the faulty address (5,3) and the first status information to the fourth BIRA FSM 224-4 without execution of any extra operation because the faulty address (5,3) of the spare pivot has been already stored in the first storage region 213-21 of the second shared space 213-2. The fourth BIRA FSM 224-4 may operate to store the faulty address (5,3) of the spare pivot into the first storage region 213-41 of the fourth shared space 213-4. Thus, "5" and "3" may be recorded as the second row address R2 and the second column address C2 of the first storage region 213-41 of the fourth shared space 213-4, respectively.

Figure 19:
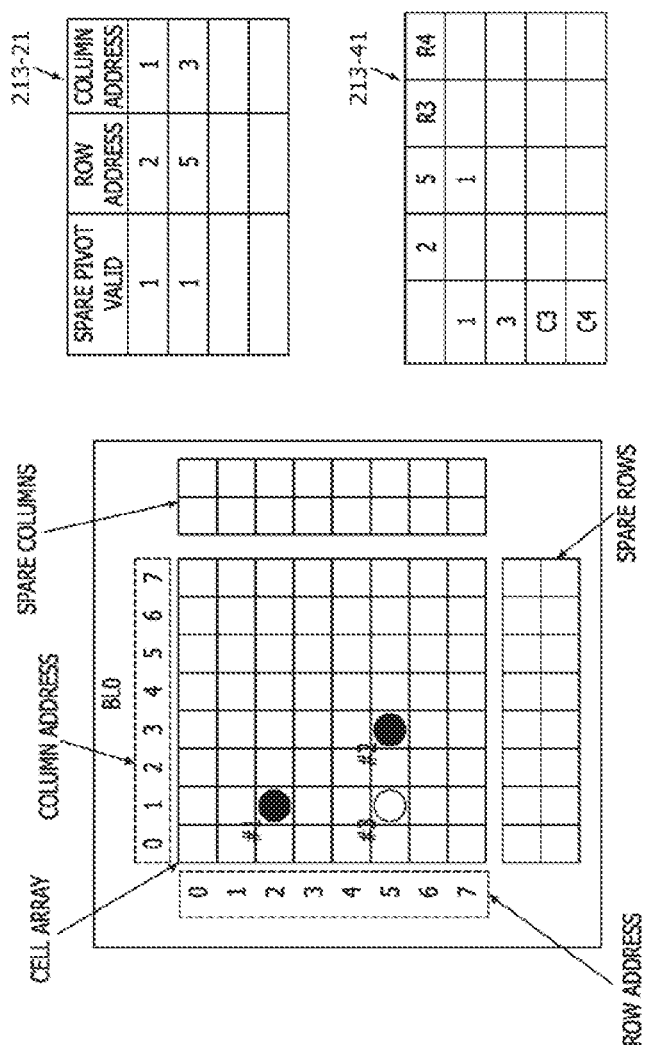

Next, as illustrated in FIG. 19, it may be assumed that the faulty cell having a faulty address (5,1) is thirdly tested while the first memory block BL0 is tested by the BIST circuit (222 of FIG. 1). In such a case, the BIST circuit 222 may output the faulty address (5,1) of the faulty cell to the BIRA circuit (224 of FIG. 1). The faulty address (5,1) may be temporarily stored into the first shared space 213-1 by a control operation of the first BIRA FSM 224-1 of the BIRA circuit 224 and may then be transmitted to the second BIRA FSM 224-2 of the BIRA circuit 224. The row address "5" and the column address "1" of the faulty address (5,1) are identical to the row address "5" of the second faulty cell (indicated by a symbol "#2") and the column address "1" of the first faulty cell (indicated by a symbol "#1"), respectively. Thus, the faulty cell having the faulty address (5,1) may correspond to the non-spare pivot having a cross status. The second and third BIRA FSMs 224-2 and 224-3 configured to perform the BIRA operation for the spare pivot may transmit the faulty address (5,1) and the fourth status information to the fourth BIRA FSM 224-4 without execution of any extra operation. The fourth BIRA FSM 224-4 may operate to store the faulty address (5,1) of the non-spare pivot having the cross status into the first storage region 213-41 of the fourth shared space 213-4. Thus, "1" may be recoded into a region where the second row address "5" and the first column address "1" of the first storage region 213-41 included in the fourth shared space 213-4 intersect each other.

Figure 20:
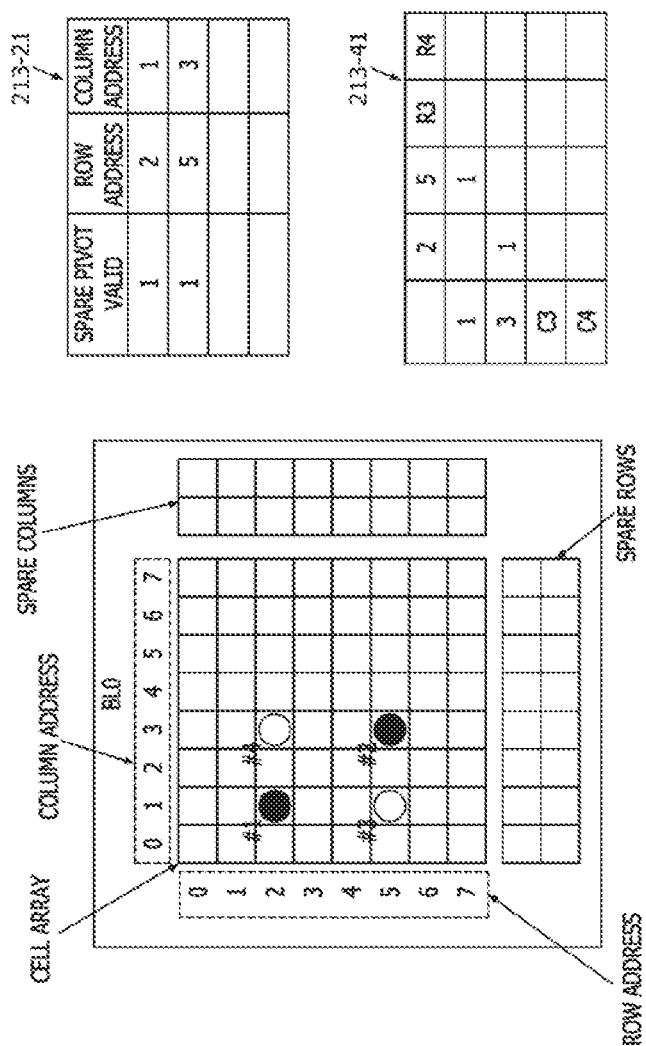

Next, as illustrated in FIG. 20, it may be assumed that the faulty cell having a faulty address (2,3) is fourthly tested while the first memory block BL0 is tested by the BIST circuit (222 of FIG. 1). In such a case, the BIST circuit 222 may output the faulty address (2,3) of the faulty cell to the BIRA circuit (224 of FIG. 1). The faulty address (2,3) may be temporarily stored into the first shared space 213-1 by a control operation of the first BIRA FSM 224-1 of the BIRA circuit 224 and may then be transmitted to the second BIRA FSM 224-2 of the BIRA circuit 224. The row address "2" and the column address "3" of the faulty address (2,3) are identical to the row address "2" of the first faulty cell (indicated by a symbol "#1") and the column address "3" of the second faulty cell (indicated by a symbol "#2"), respectively. Thus, the faulty cell having the faulty address (2,3) may correspond to the non-spare pivot having a cross status. The second and third BIRA FSMs 224-2 and 224-3 configured to perform the BIRA operation for the spare pivot may transmit the faulty address (2,3) and the fourth status information to the fourth BIRA FSM 224-4 without execution of any extra operation. The fourth BIRA FSM 224-4 may operate to store the faulty address (2,3) of the non-spare pivot having the cross status into the first storage region 213-41 of the fourth shared space 213-4. Thus, "1" may be recoded into a region where the first row address "2" and the second column address "3" of the first storage region 213-41 included in the fourth shared space 213-4 intersect each other.

Figure 21:
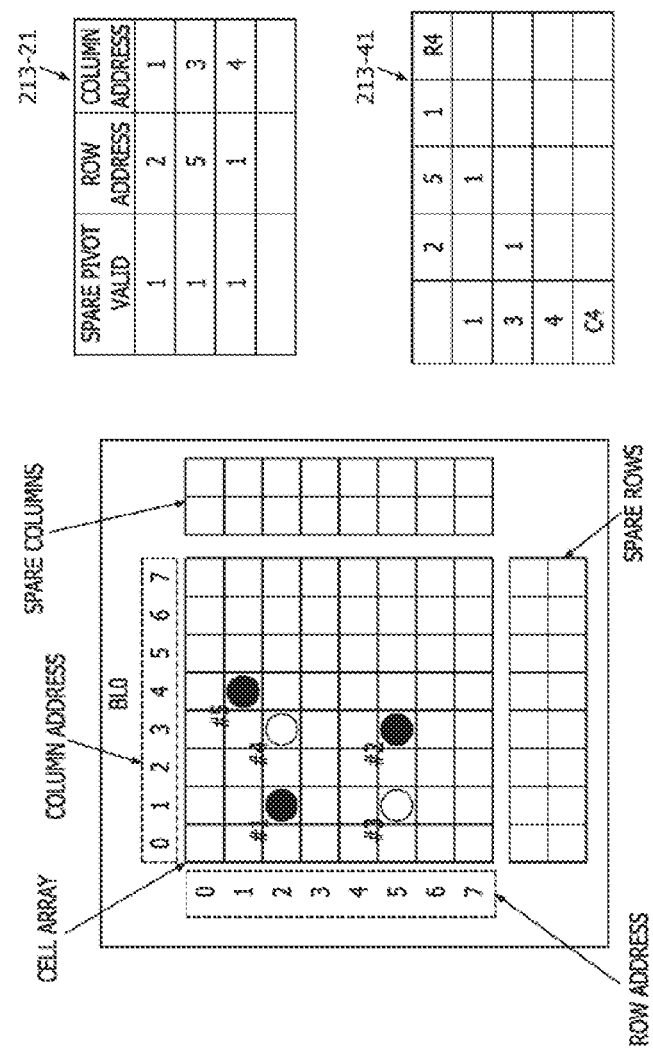

Next, as illustrated in FIG. 21, it may be assumed that the faulty cell having a faulty address (1,4) is fifthly tested while the first memory block BL0 is tested by the BIST circuit (222 of FIG. 1). In such a case, the BIST circuit 222 may output the faulty address (1,4) of the faulty cell to the BIRA circuit (224 of FIG. 1). The faulty address (1,4) may be temporarily stored into the first shared space 213-1 by a control operation of the first BIRA FSM 224-1 of the BIRA circuit 224 and may then be transmitted to the second BIRA FSM 224-2 of the BIRA circuit 224. Because the row address "1" of the faulty address (1,4) is different from the row addresses "2" and "5" of the faulty cells detected previously and the column address "4" of the faulty address (1,4) is different from the column addresses "1" and "3" of the faulty cells detected previously, the faulty cell having the faulty address (1,4) may correspond to the spare pivot. The second BIRA FSM 224-2 may operate to store the spare pivot valid data of "1," the row address of "1," and the column address of "4" into the first storage region 213-21 of the second shared space 213-2. In addition, the second BIRA FSM 224-2 may transmit the faulty address (1,4) and the first status information to the third BIRA FSM 224-3. The third BIRA FSM 224-3 may transmit the faulty address (1,4) and the first status information to the fourth BIRA FSM 224-4 without execution of any extra operation because the faulty address (1,4) of the spare pivot has been already stored in the first storage region 213-21 of the second shared space 213-2. The fourth BIRA FSM 224-4 may operate to store the faulty address (1,4) of the spare pivot into the first storage region 213-41 of the fourth shared space 213-4. Thus, "1" and "4" may be recorded as the third row address R3 and the third column address C3 of the first storage region 213-41 of the fourth shared space 213-4, respectively.

Figure 22:
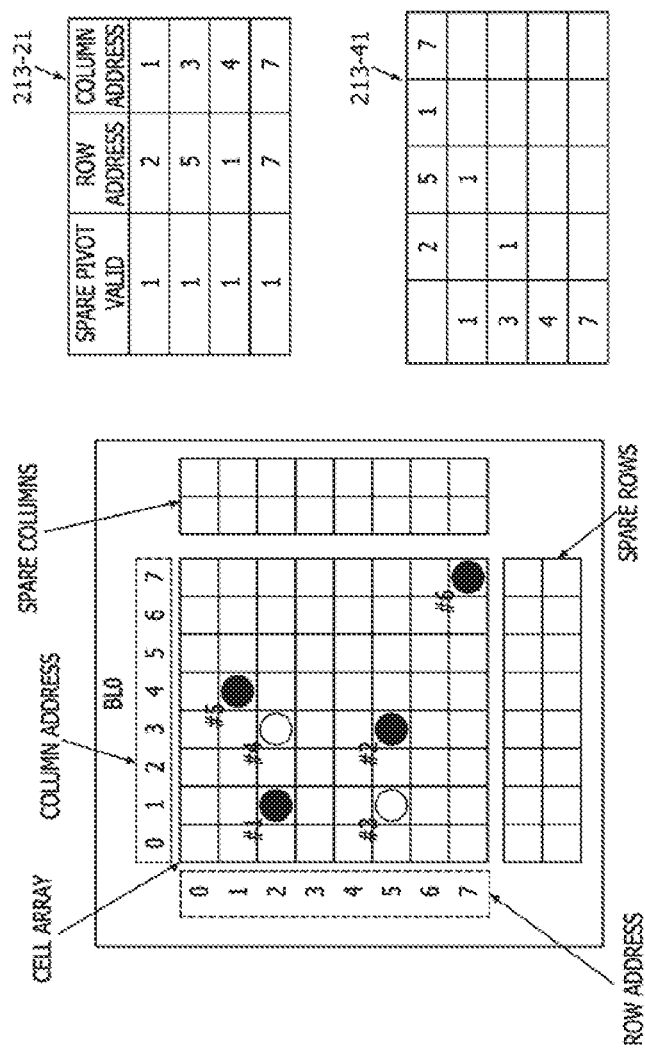

Next, as illustrated in FIG. 22, it may be assumed that the faulty cell having a faulty address (7,7) is sixthly tested while the first memory block BL0 is tested by the BIST circuit (222 of FIG. 1). In such a case, the BIST circuit 222 may output the faulty address (7,7) of the faulty cell to the BIRA circuit (224 of FIG. 1). The faulty address (7,7) may be temporarily stored into the first shared space 213-1 by a control operation of the first BIRA FSM 224-1 of the BIRA circuit 224 and may then be transmitted to the second BIRA FSM 224-2 of the BIRA circuit 224. Because the row address "7" of the faulty address (7,7) is different from the row addresses "2," "5," and "1" of the faulty cells detected previously and the column address "7" of the faulty address (7,7) is different from the column addresses "1," "3," and "4" of the faulty cells detected previously, the faulty cell having the faulty address (7,7) may correspond to the spare pivot. The second BIRA FSM 224-2 may operate to store the spare pivot valid data of "1," the row address of "7," and the column address of "7" into the first storage region 213-21 of the second shared space 213-2. In addition, the second BIRA FSM 224-2 may transmit the faulty address (7,7) and the first status information to the third BIRA FSM 224-3. The third BIRA FSM 224-3 may transmit the faulty address (7,7) and the first status information to the fourth BIRA FSM 224-4 without execution of any extra operation because the faulty address (7,7) of the spare pivot has been already stored in the first storage region 213-21 of the second shared space 213-2. The fourth BIRA FSM 224-4 may operate to store the faulty address (7,7) of the spare pivot into the first storage region 213-41 of the fourth shared space 213-4. Thus, "7" may be recorded as the fourth row address R4 and the fourth column address C4 of the first storage region 213-41 of the fourth shared space 213-4.

Figure 23:
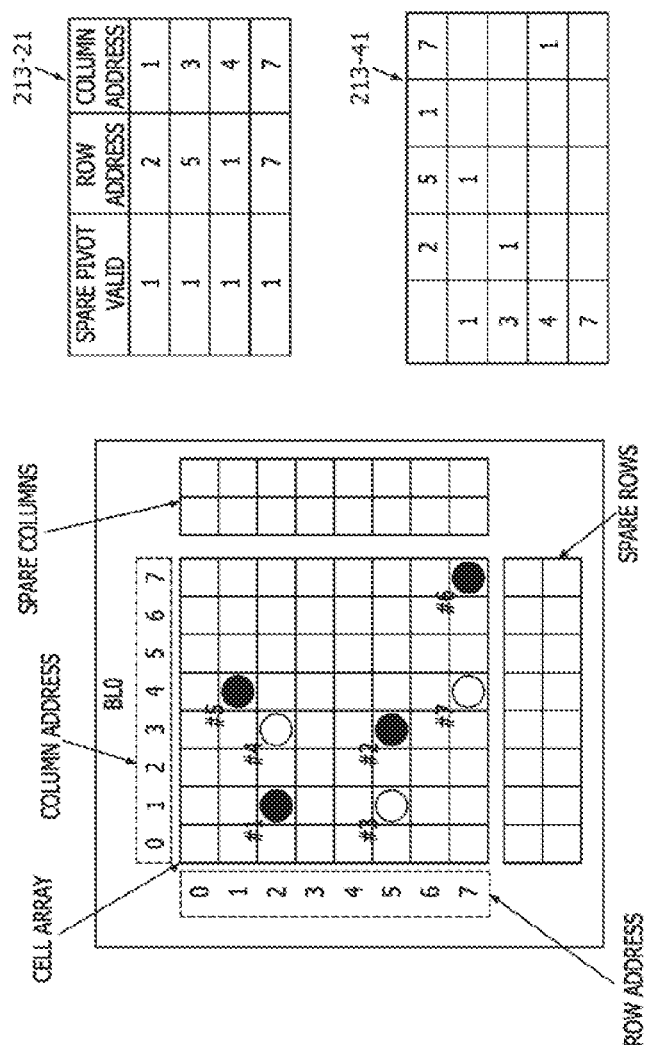

Next, as illustrated in FIG. 23, it may be assumed that the faulty cell having a faulty address (7,4) is seventhly tested while the first memory block BL0 is tested by the BIST circuit (222 of FIG. 1). In such a case, the BIST circuit 222 may output the faulty address (7,4) of the faulty cell to the BIRA circuit (224 of FIG. 1). The faulty address (7,4) may be temporarily stored into the first shared space 213-1 by a control operation of the first BIRA FSM 224-1 of the BIRA circuit 224 and may then be transmitted to the second BIRA FSM 224-2 of the BIRA circuit 224. The row address "7" and the column address "4" of the faulty address (7,4) are identical to the row address "7" of the sixth faulty cell (indicated by a symbol "#6") and the column address "4" of the fifth faulty cell (indicated by a symbol "#5"), respectively. Thus, the faulty cell having the faulty address (7,4) may correspond to the non-spare pivot having a cross status. The second and third BIRA FSMs 224-2 and 224-3 configured to perform the BIRA operation for the spare pivot may transmit the faulty address (7,4) and the fourth status information to the fourth BIRA FSM 224-4 without execution of any extra operation. The fourth BIRA FSM 224-4 may operate to store the faulty address (7,4) of the non-spare pivot having the cross status into the first storage region 213-41 of the fourth shared space 213-4. Thus, "1" may be recoded into a region where the fourth row address "7" and the third column address "4" of the first storage region 213-41 included in the fourth shared space 213-4 intersect each other.

Figure 24:
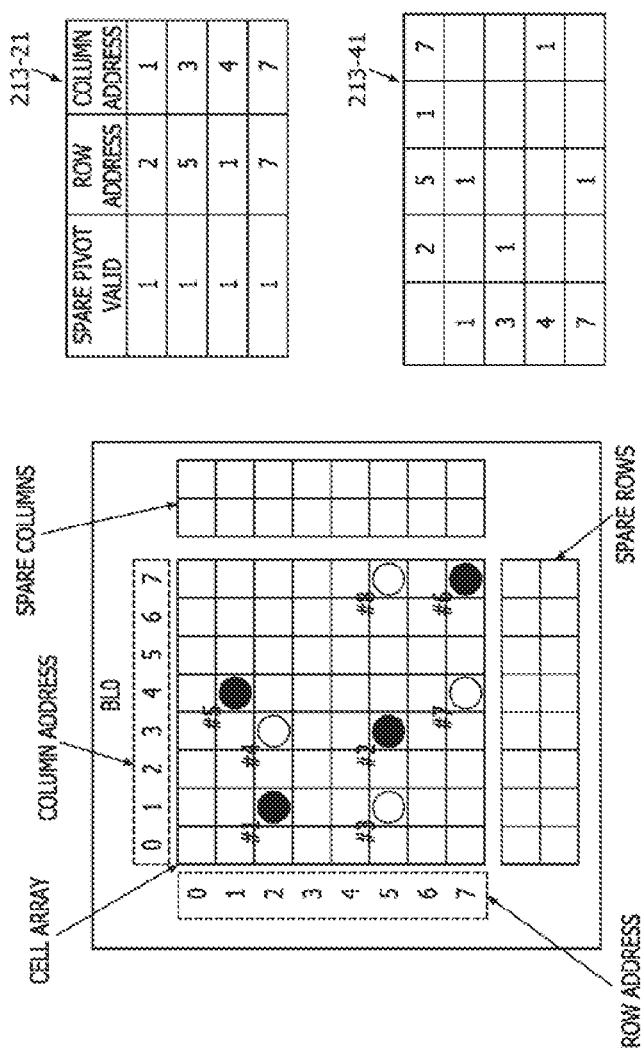

Next, as illustrated in FIG. 24, it may be assumed that the faulty cell having a faulty address (5,7) is eighthly tested while the first memory block BL0 is tested by the BIST circuit (222 of FIG. 1). In such a case, the BIST circuit 222 may output the faulty address (5,7) of the faulty cell to the BIRA circuit (224 of FIG. 1). The faulty address (5,7) may be temporarily stored into the first shared space 213-1 by a control operation of the first BIRA FSM 224-1 of the BIRA circuit 224 and may then be transmitted to the second BIRA FSM 224-2 of the BIRA circuit 224. The row address "5" and the column address "7" of the faulty address (5,7) are identical to the row address "5" of the second faulty cell (indicated by a symbol "#2") and the column address "7" of the sixth faulty cell (indicated by a symbol "#6"), respectively. Thus, the faulty cell having the faulty address (5,7) may correspond to the non-spare pivot having a cross status. The second and third BIRA FSMs 224-2 and 224-3 configured to perform the BIRA operation for the spare pivot may transmit the faulty address (5,7) and the fourth status information to the fourth BIRA FSM 224-4 without execution of any extra operation. The fourth BIRA FSM 224-4 may operate to store the faulty address (5,7) of the non-spare pivot having the cross status into the first storage region 213-41 of the fourth shared space 213-4. Thus, "1" may be recoded into a region where the second row address "5" and the fourth column address "7" of the first storage region 213-41 included in the fourth shared space 213-4 intersect each other.

Figure 25:
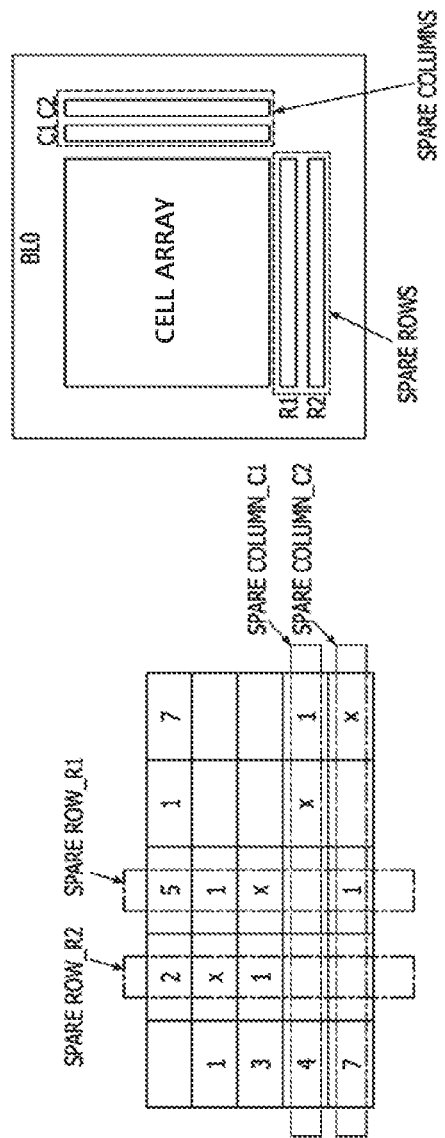

Next, as illustrated in FIG. 25, the BIRA arbiter (225 of FIG. 4) may determine a repair solution based on data which are stored in the second to fifth shared spaces 213-2, . . . , and 213-5 through the second to fifth BIRA FSMs 224-2, . . . , and 224-5. In the present embodiment, it may be assumed that the test operation of the BIST circuit (222 of FIG. 1) for the memory 100 terminates prior to an operation which is performed by the BIRA arbiter 225 to determine the repair solution. Specifically, as illustrated at a left side of FIG. 25, the faulty address information on the spare pivots may be added to the data stored in the first storage region 213-41 of the fourth shared space 213-4. In the drawing of FIG. 25, the faulty address information of the spare pivots is indicated by a character "x." Thus, the combined data of FIG. 25 may include four faulty addresses of the spare pivots and four faulty addresses of non-spare pivots having a cross status. The BIRA arbiter 225 may analyze the combined data of FIG. 25 to firstly select a row address or a column address shared by the most faulty addresses. In case of the present embodiment, the row address "5" is shared by one spare pivot and two non-spare pivots having a cross status. Thus, the row address "5" may be assigned to one of spare rows, for example, a first spare row R1.

Next, each of the row address "2," the column address "4," and the column address "7" is shared by one spare pivot and one non-spare pivot having a cross status. Thus, the row address "2" may be assigned to the remaining one of the spare rows, for example, a second spare row R2. In addition, the column address "4" and the column address "7" may be assigned to a first spare column C1 and a second spare column C2, respectively. As illustrated in a right side of FIG. 25, three faulty cells having the row address "5" of the cell array in the first memory block BL0 may be repaired using the first spare row R1, and two faulty cells having the row address "2" of the cell array in the first memory block BL0 may be repaired using the second spare row R2. In addition, two faulty cells having the column address "4" of the cell array in the first memory block BL0 may be repaired using the first spare column C1, and two faulty cells having the column address "7" of the cell array in the first memory block BL0 may be repaired using the second spare column C2.

According to the embodiments of the present teachings, faulty addresses of a memory may be stored into storage spaces of a storage space part include in a normal operation control part while a repair operation for the memory is controlled. Thus, there may be an advantage which is capable of reducing an area overhead of a repair part included in a memory controller. Moreover, in using the storage spaces in the normal operation control part of the memory controller during the repair operation, the storage spaces and BIRA FSMs may be configured to have a pipe-line structure. Thus, there may be an advantage which is capable of improving a repair speed.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A semiconductor memory device comprising:
a memory; and
a memory controller configured to control the memory, wherein the memory controller includes:
a normal operation control part configured to control a normal operation of the memory, wherein the normal operation control part includes a plurality of storage spaces used while the normal operation is controlled; and
a repair part configured to control a repair operation of the memory and configured to store faulty addresses detected while the repair operation is controlled into the plurality of storage spaces included in the normal operation control part,
wherein the storage spaces correspond to a plurality of shared spaces which are disposed to have a pipe-line structure and to be distinct from each other,
wherein the repair part includes a plurality of built-in redundancy analysis (BIRA) finite state machines (FSMs) providing a plurality of stages with the plurality of shared spaces, and
wherein each of the plurality of stages includes one of the plurality of shared spaces and one of the plurality of BIRA FSMs to perform a BIRA operation.

2. The semiconductor memory device of claim 1, wherein the memory and the memory controller have a module structure integrated on a single substrate.

3. The semiconductor memory device of claim 1,
wherein the normal operation of the memory includes a read operation and a write operation for the memory; and
wherein the repair operation of the memory includes testing the memory and replacing a faulty cell detected by testing the memory with a spare cell.

4. The semiconductor memory device of claim 1, wherein each of the plurality of storage spaces is realized using a register or a static random access memory (SRAM).

5. The semiconductor memory device of claim 1,
wherein the repair part includes a built-in self-test (BIST) circuit and a built-in redundancy analysis (BIRA) circuit;
wherein the BIST circuit is configured to perform a test operation for the memory and transmit the faulty addresses of faulty cells detected during the test operation to the BIRA circuit; and
wherein the BIRA circuit is configured to store the faulty addresses outputted from the BIST circuit into the plurality of storage spaces included in the normal operation control part and determine a repair solution based on the faulty addresses stored in the BIRA circuit.

6. The semiconductor memory device of claim 1, further comprising a selector configured to select and enable any one of a first signal transmission path between the normal operation control part and the memory and a second signal transmission path between the repair part and the memory.

7. The semiconductor memory device of claim 1, wherein the normal operation control part includes:
a multiplexer configured to receive a normal operation input signal and a repair operation input signal through respective ones of a first input terminal and a second input terminal and configured to output one of the normal operation input signal and the repair operation input signal to the plurality of storage spaces in response to a mode selection control signal; and a demultiplexer including a first output terminal connected to a transmission path in the normal operation control part and a second output terminal connected to the repair part and configured to output data outputted from the plurality of storage spaces through one of the first output terminal and the second output terminal in response to the mode selection control signal.

8. The semiconductor memory device of claim 1, wherein a first stage of the plurality of stages is configured to receive the faulty addresses from a built-in self-test (BIST) circuit and functions as a buffer.

9. The semiconductor memory device of claim 1,
wherein faulty cells are categorized as spare pivots or non-spare pivots;
wherein each of the spare pivots has a row address which is different from row addresses of the faulty cells that are previously detected and a column address which is different from column addresses of the faulty cells that are previously detected;
wherein each of the non-spare pivots has an address which is the same as at least one of row addresses and column addresses of the faulty cells that are previously detected;
wherein the non-spare pivots are categorized as non-spare pivots having a cross status or non-spare pivots having a non-cross status;
wherein each of the non-spare pivots having the cross status has a row address identical to at least one of the row addresses of the spare pivots detected previously and a column address identical to at least one of the column addresses of the spare pivots detected previously;
wherein each of the non-spare pivots having the non-cross status has a row address identical to at least one of the row address of the spare pivots detected previously and a column address different from the column addresses of the spare pivots detected previously or has a row address different from the row addresses of the spare pivots detected previously and a column address identical to at least one of the column address of the spare pivots detected previously; and
wherein some of the BIRA FSMs are configured to perform the BIRA operation for the spare pivots and some others of the BIRA FSMs perform the BIRA operation for the non-spare pivots having the cross status.

10. The semiconductor memory device of claim 9, wherein the BIRA FSMs performing the BIRA operation for the spare pivots are disposed to be ahead of the BIRA FSMs performing the BIRA operation for the non-spare pivots having the cross status.

11. The semiconductor memory device of claim 9, wherein the BIRA FSMs performing the BIRA operation for the spare pivots are configured to store row addresses and column addresses of the spare pivots into the shared spaces of the stages including the BIRA FSMs performing the BIRA operation for the spare pivots.

12. The semiconductor memory device of claim 9, wherein when a faulty address is inputted to the BIRA FSM performing the BIRA operation for the spare pivots, the BIRA FSM performing the BIRA operation for the spare pivots is configured to read out the faulty addresses stored in the shared space of the stage including the BIRA FSM and to compare the inputted faulty address with the read faulty addresses to determine whether the inputted faulty address corresponds to an address of the spare pivot.

13. The semiconductor memory device of claim 12, wherein when the inputted faulty address corresponds to an address of the spare pivot, the BIRA FSM performing the BIRA operation for the spare pivots is configured to store the inputted faulty address into the shared space of the stage including the BIRA FSM performing the BIRA operation for the spare pivots when a spare storage region exists in the shared space and the BIRA FSM performing the BIRA operation for the spare pivots is configured to generate repair-impossible information when no spare storage region exists in the shared space.

14. The semiconductor memory device of claim 12,
wherein the BIRA FSM performing the BIRA operation for the non-spare pivots having the cross status is configured to store a row address and a column address of the inputted faulty address into a shared space of the stage including the BIRA FSM performing the BIRA operation for the non-spare pivots having the cross status when the inputted faulty address corresponds to an address of the spare pivot; and
wherein the BIRA FSM performing the BIRA operation for the non-spare pivots having the cross status is configured to determine whether the inputted faulty address has a cross status or a non-cross status when the inputted faulty address corresponds to an address of the non-spare pivot.

15. The semiconductor memory device of claim 14, wherein when the inputted faulty address corresponds to the non-spare pivot having the cross status, the BIRA FSM performing the BIRA operation for the non-spare pivots having the cross status is configured to store information on the inputted faulty address corresponding to the non-spare pivot having the cross status into a region where one of row addresses of the stored spare pivots and one of column addresses of the stored spare pivots intersect each other.

16. The semiconductor memory device of claim 9, further comprising a BIRA arbiter configured to determine a repair solution for the faulty cells based on status information about the BIRA FSMs performing the BIRA operation for the spare pivots and the BIRA FSMs performing the BIRA operation for the non-spare pivots having the cross status.

* * * * *